United States Patent
Li et al.

(10) Patent No.: US 11,784,577 B2
(45) Date of Patent: Oct. 10, 2023

(54) LOW NOISE POWER CONVERSION SYSTEM AND METHOD

(71) Applicant: Huawei Digital Power Technologies Co., Ltd., Shenzhen (CN)

(72) Inventors: Yushan Li, Allen, TX (US); Heping Dai, Plano, TX (US); Dianbo Fu, Frisco, TX (US)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 282 days.

(21) Appl. No.: 16/926,516

(22) Filed: Jul. 10, 2020

(65) Prior Publication Data

US 2021/0091679 A1 Mar. 25, 2021

Related U.S. Application Data

(63) Continuation of application No. PCT/US2019/052235, filed on Sep. 20, 2019.

(51) Int. Cl.

| | |
|---|---|
| *H02M 7/217* | (2006.01) |
| *H02M 3/158* | (2006.01) |
| *H03F 3/217* | (2006.01) |
| *H03F 1/02* | (2006.01) |
| *H03F 3/24* | (2006.01) |
| *H02M 1/00* | (2006.01) |

(52) U.S. Cl.
CPC ......... *H02M 7/2176* (2013.01); *H02M 3/158* (2013.01); *H03F 1/0227* (2013.01); *H03F 1/0266* (2013.01); *H03F 3/2173* (2013.01); *H03F 3/245* (2013.01); *H02M 1/008* (2021.05); *H02M 1/0045* (2021.05)

(58) Field of Classification Search
CPC ..... H02M 7/2176; H02M 3/155–1588; H02M 1/0045; H02M 1/008; H03F 1/0227; H03F 1/0266; H03F 3/2173; H03F 3/245
See application file for complete search history.

(56) References Cited

U.S. PATENT DOCUMENTS

| | | | | |
|---|---|---|---|---|
| 4,484,150 | A * | 11/1984 | Carver | H03F 1/0244 330/297 |
| 5,543,753 | A * | 8/1996 | Williamson | H03F 1/083 363/39 |
| 5,606,289 | A * | 2/1997 | Williamson | H03F 3/2171 363/40 |
| 6,300,826 | B1 * | 10/2001 | Mathe | H03F 3/2171 330/10 |
| 6,304,066 | B1 * | 10/2001 | Wilcox | H02M 3/1588 323/290 |

(Continued)

OTHER PUBLICATIONS

Rafael Concatto Beltrame et al., "Hybrid Power Amplifiers—A Review" Power Electronics Conference (COBEP), IEEE, Sep. 11, 2011, pp. 189-195.

*Primary Examiner* — Yusef A Ahmed
(74) *Attorney, Agent, or Firm* — Slater Matsil, LLP

(57) ABSTRACT

A system includes a current-mode switcher configured to provide a direct current (DC) voltage for a noise sensitive load, and a linear amplifier connected to an output of the current-mode switcher, the linear amplifier configured to draw a reduced supply voltage through at least one power conversion device that is coupled between a power source and the linear amplifier.

5 Claims, 16 Drawing Sheets

(56) References Cited

U.S. PATENT DOCUMENTS

| | | | |
|---|---|---|---|
| 7,116,947 B2* | 10/2006 | Tanabe | H03F 1/02 455/127.1 |
| 7,207,054 B1* | 4/2007 | Richards | H03F 3/45475 323/289 |
| 7,679,433 B1* | 3/2010 | Li | H03F 1/0266 330/297 |
| 8,698,558 B2* | 4/2014 | Mathe | H03F 1/0227 330/297 |
| 9,112,409 B2* | 8/2015 | Li | H02M 3/158 |
| 9,276,475 B2* | 3/2016 | Barth | H02M 5/293 |
| 9,379,668 B1* | 6/2016 | Lerdworatawee | H03F 3/211 |
| 9,602,057 B1* | 3/2017 | Youn | H03F 3/21 |
| 10,079,576 B2* | 9/2018 | Wimpenny | H03F 3/20 |
| 10,673,385 B2* | 6/2020 | Lin | H02M 3/158 |
| 11,088,660 B2* | 8/2021 | Lin | H03F 1/0227 |
| 2008/0157895 A1* | 7/2008 | Immonen | H03F 3/68 332/155 |
| 2008/0272750 A1* | 11/2008 | Aitto-Oja | H03F 1/0211 323/266 |
| 2009/0289720 A1* | 11/2009 | Takinami | H03F 3/24 330/297 |
| 2010/0164630 A1 | 7/2010 | Witmer et al. | |
| 2011/0260703 A1* | 10/2011 | Laur | H02M 3/1563 323/271 |
| 2012/0212293 A1* | 8/2012 | Khlat | H03F 3/24 330/127 |
| 2012/0313701 A1* | 12/2012 | Khlat | H02M 3/07 330/127 |
| 2012/0326686 A1* | 12/2012 | Dai | H04B 15/005 323/283 |
| 2012/0326783 A1* | 12/2012 | Mathe | H03F 1/0227 330/251 |
| 2013/0271225 A1* | 10/2013 | Tseng | H03F 3/21 330/297 |
| 2014/0042999 A1* | 2/2014 | Barth | H02M 5/293 323/271 |
| 2014/0139199 A1* | 5/2014 | Khlat | H02M 3/1582 323/282 |
| 2014/0203868 A1* | 7/2014 | Khlat | H03F 1/0227 330/127 |
| 2014/0327485 A1* | 11/2014 | Tseng | H03F 3/195 330/297 |
| 2014/0361830 A1* | 12/2014 | Mathe | H03F 3/195 330/127 |
| 2015/0155783 A1* | 6/2015 | Li | H03F 3/2173 323/271 |
| 2015/0188432 A1* | 7/2015 | Vannorsdel | H02M 3/156 323/271 |
| 2015/0349816 A1* | 12/2015 | Lim | H04B 1/0475 375/297 |
| 2016/0134246 A1* | 5/2016 | Kim | H03F 1/0211 330/251 |
| 2016/0149501 A1* | 5/2016 | Dai | H02M 3/07 363/21.02 |
| 2017/0222554 A1* | 8/2017 | Jatavallabhula | H02M 3/158 |
| 2018/0198430 A1 | 7/2018 | Link et al. | |
| 2018/0316322 A1* | 11/2018 | D'Souza | H03F 3/3035 |
| 2019/0140597 A1* | 5/2019 | Lin | H03F 1/0227 |
| 2021/0067097 A1* | 3/2021 | Wang | H03F 1/0227 |

\* cited by examiner

LOW NOISE POWER CONVERSION SYSTEM AND METHOD

PRIORITY CLAIM

This application is a continuation of International Application No. PCT/US2019/052235, entitled, "Low Noise Power Conversion System and Method" and filed on Sep. 20, 2019, which is hereby incorporated by reference in its entirety.

TECHNICAL FIELD

The present disclosure relates to a high efficiency low noise power conversion system, and, in particular embodiments, to a high efficiency low noise power supply for a noise sensitive load.

BACKGROUND

As technologies further advance, a variety of electronic devices, such as mobile phones, tablet PCs, digital cameras, MP3 players and/or the like, have become popular. Each electronic device requires direct current power at a substantially constant voltage which may be regulated within a specified range even when the current drawn by the electronic device may vary over a wide range. When an input voltage is lower than the specific range, a step-up converter may be employed to convert the input voltage into a regulated voltage within the specific range. On the other hand, when the input voltage is higher than the specific range, a step-down converter may be used to convert the voltage of the input power source into a lower voltage to satisfy the operational voltage to which the electronic circuit is specified.

There may be a variety of conversion topologies. In accordance with the topology difference, power converters can be divided into three categories, namely, switching power converters, linear regulators and switched-capacitor converters. Inductor based switching converters or switched-capacitor converters are often used in power supplies for high efficiency. The downside of these high efficiency converters is switching noise (e.g., ripple current components) may be generated at their outputs.

In many applications such as radio frequency (RF) transmitters and receivers, the noise requirements are strict. As a result, additional efforts are required to reduce the switching noise. A low drop out regulator (LDO) can be used as a downstream regulator connected between a switching mode power supply and a noise sensitive load for reducing the noise applied to the noise sensitive load. When an output voltage of an LDO is close to an input voltage of the LDO, the LDO is efficient. Otherwise, the efficiency of the LDO is low compared with switching converters. There are some design and performance limitations to set the input of a LDO and an output of the LDO close to each other.

In the applications (e.g., multiple-input and multiple output antennas) requiring both high efficiency and low noise, it is desirable to have a power conversion system capable of efficiently converting power and providing a noise free output voltage.

SUMMARY

These and other problems are generally solved or circumvented, and technical advantages are generally achieved, by preferred embodiments of the present disclosure which provide a high efficiency low noise power supply for a noise sensitive load.

In accordance with an embodiment, a system comprises a current-mode switcher configured to provide a direct current (DC) voltage for a noise sensitive load, and a linear amplifier connected to an output of the current-mode switcher, the linear amplifier configured to draw a reduced supply voltage through at least one power conversion device that is coupled between a power source and the linear amplifier.

A first voltage rail of the linear amplifier is configured to be connected to an output of a sourcing power converter. A second voltage rail of the linear amplifier is configured to be connected to an output of a sinking power converter, the linear amplifier being configured to reduce ripple current components generated by the current-mode switcher, the sourcing power converter and the sinking power converter being configured to reduce a supply voltage of the linear amplifier.

In some embodiments, the sourcing power converter is a buck power converter connected between the power source and the first voltage rail of the linear amplifier. The sinking power converter is a switched-capacitor power converter configured as a 2:1 step-down power converter having an input connected to an output of the buck power converter.

In some embodiments, the sourcing power converter is a first buck power converter connected between the power source and the first voltage rail of the linear amplifier. The sinking power converter is a second buck power converter having an input connected to an output of the first buck power converter.

In some embodiments, the sourcing power converter is a boost power converter connected between the power source and the first voltage rail of the linear amplifier. The sinking power converter is a buck power converter having an input connected to an output of the boost power converter.

In some embodiments, the sourcing power converter is a boost power converter connected between the output of the sinking power converter and the first voltage rail of the linear amplifier. The sinking power converter is a buck power converter connected between the power source and the second voltage rail of the linear amplifier.

In some embodiments, the sourcing power converter is a buck-boost power converter connected between the power source and the first voltage rail of the linear amplifier. The sinking power converter is a buck power converter having an input connected to an output of the buck-boost power converter.

The current-mode switcher includes a first switch and a second switch connected in series, an inductor connected between the output of the current-mode switcher and a common node of the first switch and the second switch, a pulse width modulation (PWM) driver configured to generate gate drive signals for the first switch and the second switch, and a current comparator having an inverting input configured to receive a current sense signal proportional to a current flowing through the inductor, and non-inverting input connected to ground.

The linear amplifier includes a third switch and a fourth switch connected in series between the first voltage rail and the second voltage rail of the linear amplifier, and a comparator configured to generate gate drive signals for the third switch and the fourth switch.

In some embodiments, a first voltage rail of the linear amplifier is configured to be connected to the power source through a sourcing power converter. A second voltage rail of the linear amplifier is connected to ground, the linear amplifier is configured to reduce ripple current components generated by the current-mode switcher, and the sourcing power converter is configured to reduce a supply voltage of the linear amplifier.

In some embodiments, a first voltage rail of the linear amplifier is configured to be connected to the power source directly. A second voltage rail of the linear amplifier is configured to be connected to an output of a sinking power converter having an input connected to the power source, the linear amplifier is configured to reduce ripple current components generated by the current-mode switcher, and the sinking power converter is configured to reduce a supply voltage of the linear amplifier.

In accordance with another embodiment, a system comprises a current-mode power converter configured to generate a voltage for a load, a linear amplifier connected to an output of the current-mode power converter, the linear amplifier being configured to reduce ripple current components generated by the current-mode power converter, and a rail voltage generator configured to generate a reduced supply voltage for the linear amplifier.

In some embodiments, the rail voltage generator includes a first step-down power converter connected between a power source and a first voltage rail of the linear amplifier, and a second step-down power converter connected between the first voltage rail of the linear amplifier and a second voltage rail of the linear amplifier.

In some embodiments, the rail voltage generator is a single-inductor-dual-output (SIDO) power converter having a first output connected to a first voltage rail of the linear amplifier, and a second output connected to a second voltage rail of the linear amplifier.

The current-mode power converter includes a first current-mode power conversion device and a second current-mode power conversion device connected in parallel, and wherein a transient response of the first current-mode power conversion device is faster than a transient response of the second current-mode power conversion device.

The first current-mode power conversion device is configured to reduce ripple current components generated by the second current-mode power conversion device. The linear amplifier is configured to reduce ripple current components generated by the first current-mode power conversion device.

In accordance with yet another embodiment, a method comprises configuring a current-mode power converter to operate in a switching mode, configuring a linear amplifier to reduce ripple current components generated by the current-mode power converter, and reducing power losses of the linear amplifier through applying a reduced supply voltage to the linear amplifier.

The method further comprises generating the reduced supply voltage through converting an output voltage of a power source to a first voltage through a sourcing power converter, and converting the first voltage to a second voltage through a sinking power converter, wherein the sourcing power converter and the sinking power converter are step-down power converters.

In some embodiments, the sourcing power converter is a buck power converter. The sinking power converter is a switched-capacitor power converter. The linear amplifier includes a sourcing leg connected to the sourcing power converter, and a sinking leg connected to the sinking power converter.

The method further comprises during a light load operating mode, disabling the sinking power converter, the sinking leg and the current-mode power converter.

An advantage of an embodiment of the present disclosure is achieving a high efficiency low noise power supply for driving a noise sensitive load.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a high efficiency low noise power conversion system. The present disclosure may also be applied, however, to a variety of power conversion systems. Hereinafter, various embodiments will be explained in detail with reference to the accompanying drawings.

Figure 1:
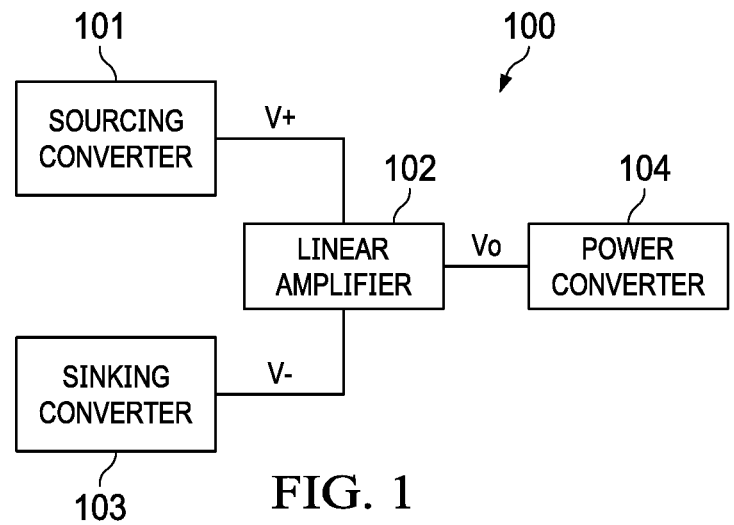
FIG. 1 illustrates a block diagram of a low noise power conversion system in accordance with various embodiments of the present disclosure.

FIG. 1 illustrates a block diagram of a low noise power conversion system in accordance with various embodiments of the present disclosure. The low noise power conversion system 100 comprises a power converter 104, a linear amplifier 102, a sourcing converter 101 and a sinking converter 103. As shown in FIG. 1, an output of the power converter 104 is connected to an output of the linear amplifier 102. The common node of the power converter 104 and the linear amplifier 102 is the output Vo of the low noise power conversion system 100. The linear amplifier 102 is supplied by two voltage rails, namely a first voltage rail V+ and a second voltage rail V− as shown in FIG. 1. The source converter 101 is configured to establish the first voltage rail V+ for the linear amplifier 102. The sinking converter 103 is configured to establish the second voltage rail V− for the linear amplifier 102.

The linear amplifier 102 is connected between the first voltage rail V+ and the second voltage rail V−. In some embodiments, both the sourcing converter 101 and the sinking converter 103 are implemented as step-down power converters. The sourcing converter 101 is configured to convert an output voltage of a power source to a lower voltage, which is applied to the first voltage rail V+. Likewise, the sinking converter 103 is configured to generate a voltage higher than the ground voltage potential. The output voltage of the sinking converter 103 is applied to the second voltage rail V−. As a result, The first voltage rail V+ and the second voltage rail V− form a reduced supply voltage for the linear amplifier 102. Throughout the description, the sourcing converter 101 and the sinking converter 103 may be collectively referred to as a rail voltage generator, which is employed to reduce the supply voltage of the linear amplifier 102.

In operation, the power converter 104 is configured to operate in a switching mode. The power converter 104 is employed to generate a dc voltage for a noise sensitive load. The linear amplifier 102 is employed to generate ripple current components to eliminate or almost eliminate the ripple current components generated by the power converter 104. As a result of eliminating the ripple current components generated by the power converter 104, a dc voltage having zero ripple current components is applied to the noise sensitive load.

In some embodiments, the power loss of the linear amplifier 102 is proportional to the ripple current components generated by the linear amplifier 102 times the voltage difference between the first voltage rail V+ and the second voltage rail V−. As such, the power loss of the linear amplifier 102 can be reduced by reducing the voltage difference between the first voltage rail V+ and the second voltage rail V−.

The sourcing converter 101 and the sinking converter 103 are employed to control the rail voltages applied to the linear amplifier 102. More particularly, the sourcing converter 101 and the sinking converter 103 are employed to reduce the voltage difference between the first voltage rail V+ and the second voltage rail V−. In other words, the sourcing converter 101 and the sinking converter 103 are employed to reduce the voltage variation range of the linear amplifier 102. As a result of having a reduced voltage difference between the first voltage rail V+ and the second voltage rail V−, the power losses (conduction losses and switching losses) of the linear amplifier 102 is reduced accordingly.

In some embodiments, the power converter 104 is implemented as a current-mode switcher. The detailed structure of the current-mode switcher will be discussed below with respect to FIG. 5. Throughout the description, the power converter 104 may be alternatively referred to as a current-mode switcher or a current-mode power converter. The sourcing converter 101 may be implemented as a step-down power converter such as a buck power converter. Alternatively, depending on different applications and design needs, the sourcing converter 101 can be implemented as any suitable power converters such as boost power converters, buck-boost converters, linear regulators, switched-capacitor converters, any combinations thereof and the like. Likewise, the sinking converter 103 may be implemented as a step-down power converter such as a buck power converter.

Alternatively, depending on different applications and design needs, the sinking converter 103 can be implemented as any suitable power converters such as boost power converters, buck-boost converters, linear regulators, switched-capacitor converters, any combinations thereof and the like.

Figure 2:
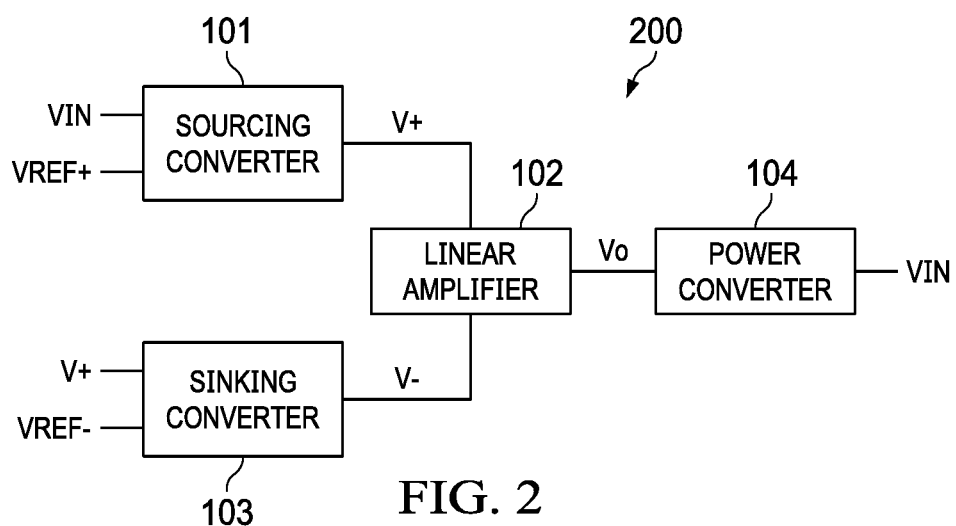
FIG. 2 illustrates a block diagram of a first implementation of the low noise power conversion system shown in FIG. 1 in accordance with various embodiments of the present disclosure.

FIG. 2 illustrates a block diagram of a first implementation of the low noise power conversion system shown in FIG. 1 in accordance with various embodiments of the present disclosure. The low noise power conversion system 200 comprises the power converter 104, the linear amplifier 102, the sourcing converter 101 and the sinking converter 103. As shown in FIG. 2, the sourcing converter 101 is connected between a power source VIN and the first voltage rail V+. The sourcing converter 101 is configured to receive a reference signal VREF+. The reference signal VREF+ is employed to set the voltage on the first voltage rail V+. The sourcing converter 101 converts VIN to a lower voltage determined by the reference signal VREF+.

As shown in FIG. 2, the sinking converter 103 is connected between the first voltage rail V+ and the second voltage rail V−. The sinking converter 103 is configured to receive a reference signal VREF−. The reference signal VREF− is employed to set the voltage on the second voltage rail V+. The sinking converter 103 converts V+ to a lower voltage determined by the reference signal VREF−.

The power converter 104 is connected to the power source VIN as shown in FIG. 2. The power converter 104 converts VIN to Vo. The linear amplifier 102 generates ripple current components to eliminate or almost eliminate the ripple current components generated by the power converter 104.

It should be noted the setting of the voltage rails V+ and V− may vary depending on different applications and design needs. The reference signals VREF+ and VREF+ may be generated internally or externally. Furthermore, in an alternative embodiment, the voltage rails V+ and/or V− rails may be generated with an open-loop. In other words, the reference signals VREF+ and/or VREF+ may not exist.

It should further be noted that the control circuit (not shown) of the linear amplifier 102 may or may not be connected to the voltage rails V+ and V−. For example, the power switches of the linear amplifier 102 are connected to the voltage rails V+ and V−. The control circuit of the linear amplifier 102 may be connected to VIN directly. It should be noted that the second voltage rail V− rail is for energy recovery purposes. A negative load current flows through the second voltage rail V−.

Figure 3:
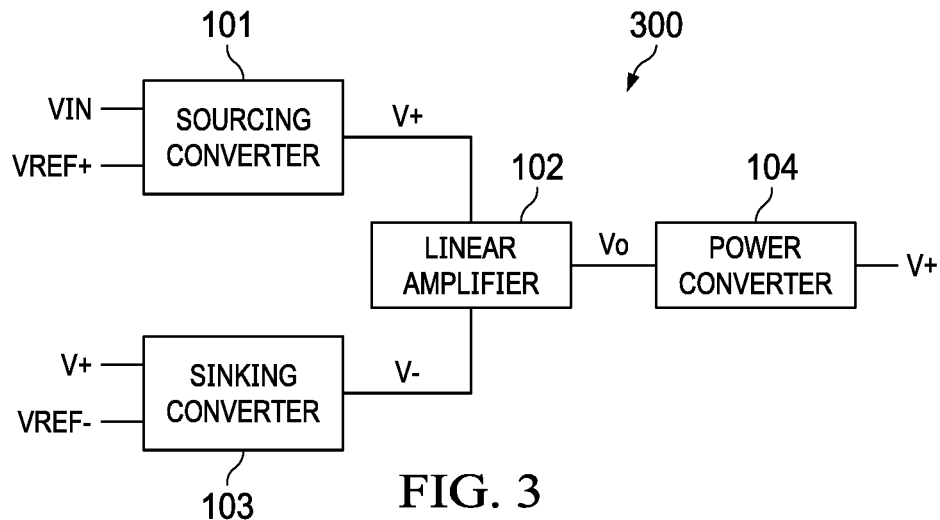
FIG. 3 illustrates a block diagram of a second implementation of the low noise power conversion system shown in FIG. 1 in accordance with various embodiments of the present disclosure.

FIG. 3 illustrates a block diagram of a second implementation of the low noise power conversion system shown in FIG. 1 in accordance with various embodiments of the present disclosure. The low noise power conversion system 300 is similar to the low noise power conversion system 200 shown in FIG. 2 except that the input of the power converter 104 is connected to the first voltage rail V+. The power converter 104 converts V+ to Vo. The linear amplifier 102 generates ripple current components to eliminate or almost eliminate the ripple current components generated by the power converter 104.

One advantageous feature of having the input of the power converter 104 connected to the first voltage rail V+ is the power losses of the power converter 104 can be reduced through a reduced supply voltage applied to the power converter 104.

Figure 4:
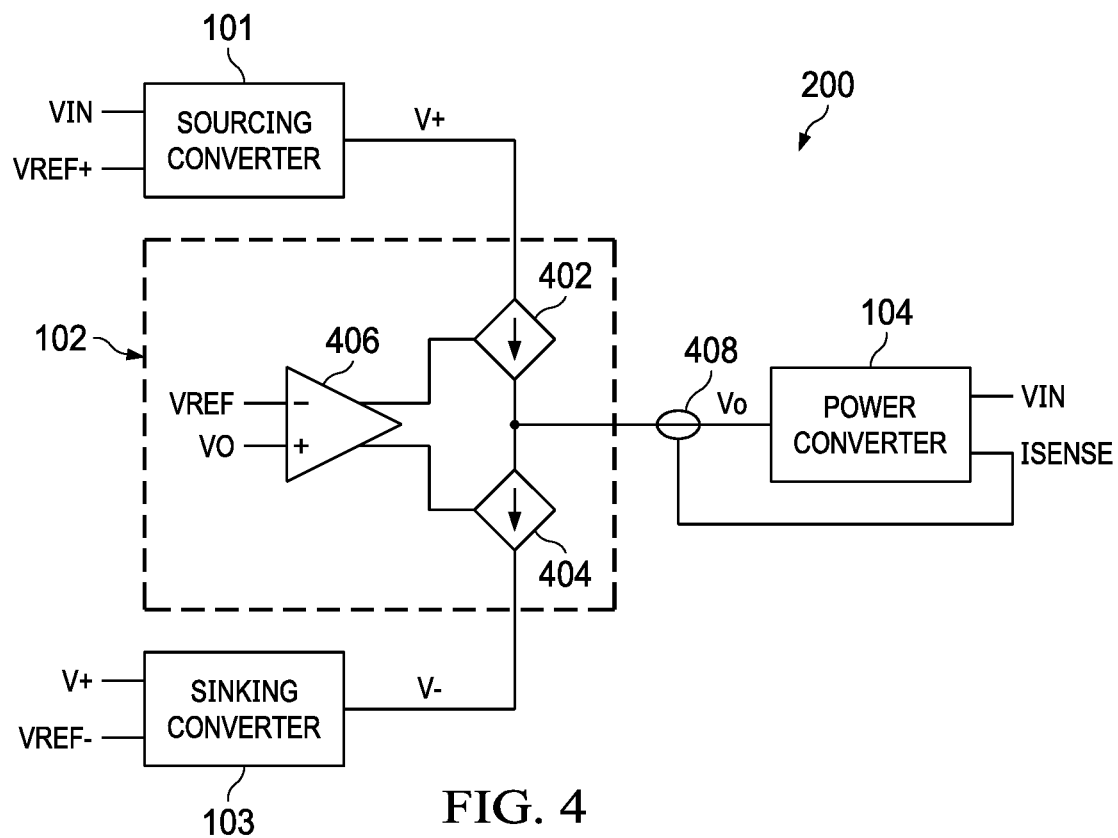
FIG. 4 illustrates a block diagram of the linear amplifier and the power converter shown in FIG. 2 in accordance with various embodiments of the present disclosure.

FIG. 4 illustrates a block diagram of the linear amplifier and the power converter shown in FIG. 2 in accordance with various embodiments of the present disclosure. The linear amplifier 102 comprises a sourcing leg 402 and a sinking leg 404. As shown in FIG. 4, the sourcing leg 402 and the sinking leg 404 are connected in series between the first voltage rail V+ and the second voltage rail V−. The common node of the sourcing leg 402 and the sinking leg 404 is connected to the output of the power converter 104.

A comparator 406 is employed to control the operation of the sourcing leg 402 and the sinking leg 404. As shown in FIG. 4, an inverting input of the comparator 406 is connected to a predetermined reference VREF. A non-inverting input of the comparator 406 is connected to the output of the power converter 104. Based on the predetermined reference VREF and the detected output voltage Vo, the comparator 406 generates control signals applied to the sourcing leg 402 and the sinking leg 404, respectively as shown in FIG. 4. It should be noted that VREF is greater than VREF− and less than VREF+.

In operation, the sourcing leg 402 and the sinking leg 404 are configured to generate ripple current components to eliminate or almost eliminate the ripple components generated by the power converter 104.

The power converter 104 is implemented as a current-mode switcher. The detailed structure of the power converter 104 will be described below with respect to FIG. 5. A current sensor 408 is employed to detect a current flowing out of the power converter 104. The detected current signal is fed into the power converter 104. Based on the detected current signal ISENSE, the power converter 104 generates the output voltage Vo. The current sensor 408 can be implemented as any suitable current sensors such as a sensing resistor, a current transformer and the like.

Figure 5:
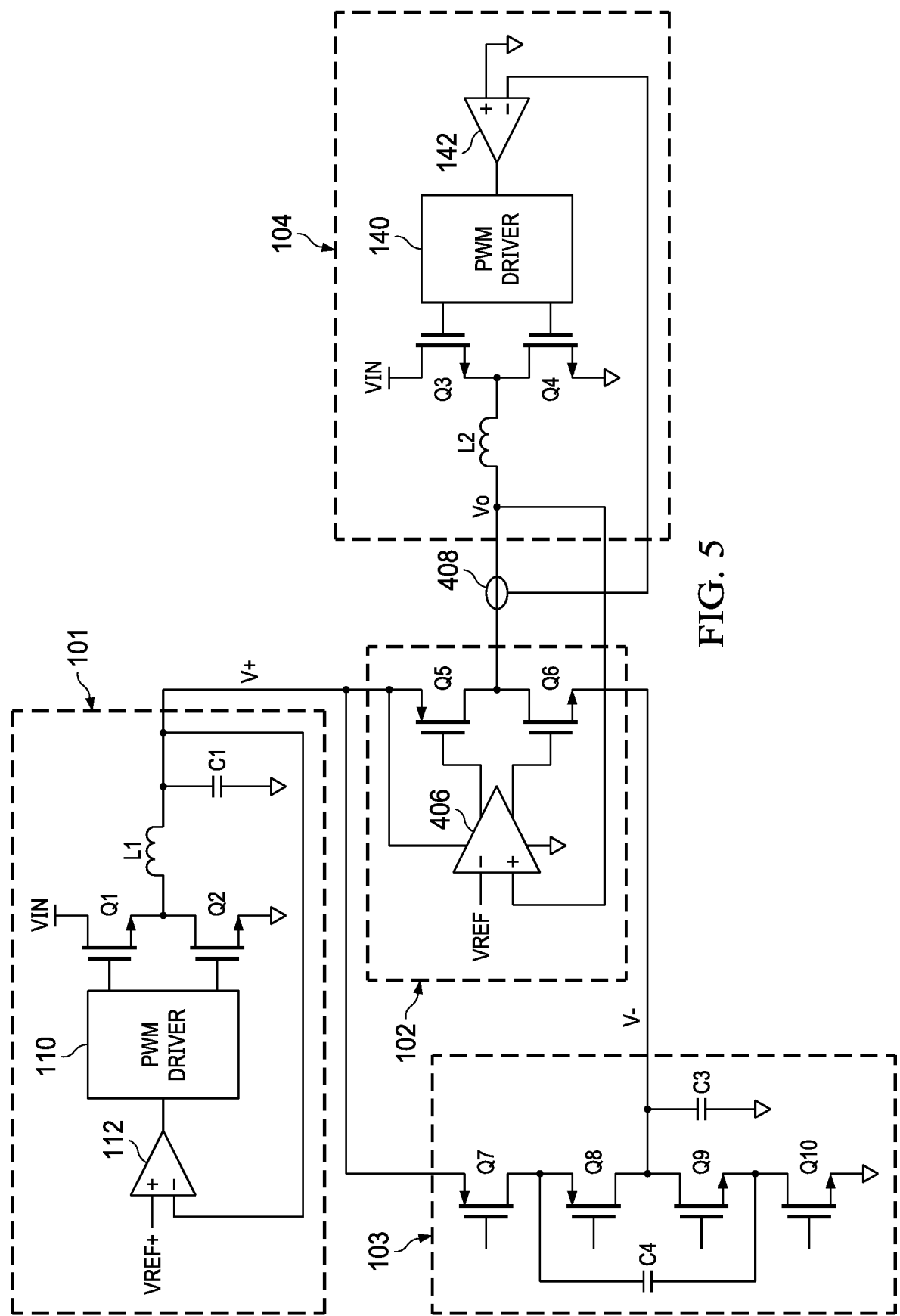
FIG. 5 illustrates a schematic diagram of a first implementation of the low noise power conversion system shown in FIG. 2 in accordance with various embodiments of the present disclosure.

FIG. 5 illustrates a schematic diagram of a first implementation of the low noise power conversion system shown in FIG. 2 in accordance with various embodiments of the present disclosure. In some embodiments, VIN is equal to 12 V. The output voltage Vo is equal to 1.8 V. The first voltage rail V+ is equal to 2.4 V. The sourcing converter 101 is implemented as a buck converter. The sourcing converter 101 is configured to convert VIN to an output voltage equal to 2.4 V, which is used to supply the first voltage rail V+.

In some embodiments, the second voltage rail V− is set to 1.2 V. The sinking converter 103 is implemented as a switched-capacitor converter. The switched-capacitor converter is open-loop controlled. Under an open-loop, the switched-capacitor converter is configured as a 2:1 switched-capacitor converter. In other words, the output voltage of the sinking converter 103 is equal to one half of the input voltage of the sinking converter 103. The sinking converter 103 is configured to convert the output voltage of the sourcing converter to an output voltage equal to 1.2 V, which is used to supply the second voltage rail V−.

The sourcing converter 101 is implemented as a buck converter. Throughout the description, the sourcing converter 101 may be alternatively referred to as the buck converter 101. The operation of the sourcing converter 101 is controlled by a pulse width modulation (PWM) driver 110. As shown in FIG. 5, the sourcing converter 101 includes a first switch Q1, a second switch Q2, an inductor L1 and an output capacitor C1. As shown in FIG. 5, the first switch Q1 and the second switch Q2 are connected in series between the power source VIN and ground. The inductor L1 is connected between the common node of the first switch Q1 and the second switch Q2, and the positive terminal of the output capacitor C1.

In some embodiments, the first switch Q1 and the second switch Q2 are implemented as n-type transistors as shown in FIG. 5. The gate of the first switch Q1 and the gate of the second switch Q2 are controlled by the PWM driver 110.

It should be noted that the buck converter 101 shown in FIG. 5 is merely an example, which should not unduly limit the scope of the claims. One of ordinary skill in the art would recognize many variations, alternatives, and modifications. For example, the first switch Q1 may be implemented as a p-type transistor. Furthermore, the switch of the buck converter 101 (e.g., the first switch Q1) may be implemented as a plurality of n-type transistors connected in parallel.

As shown in FIG. 5, an amplifier 112 is configured to receive the output voltage of the buck converter 101 and a predetermined reference VREF+. In particular, a non-inverting input of the amplifier 112 is configured to receive the predetermined reference VREF+. An inverting input of the amplifier 112 is configured to receive the output voltage V+. Based upon the output voltage V+ and the predetermined reference VREF+, the amplifier 112 generates a control signal, which is fed into the PWM driver 110. Based on the control signal, the PWM driver 110 generates two gate signals for controlling the operation of switches Q1 and Q2. Using a PWM driver to control a buck converter is well known in the art, and hence is not discussed in further detail to avoid repetition.

It should be noted that the control circuit of the buck converter 101 shown in FIG. 5 is merely an example, which should not unduly limit the scope of the claims. One of ordinary skill in the art would recognize many variations, alternatives, and modifications. For example, the inverting input of the amplifier 112 may be connected to the output of the buck converter 101 through a suitable resistor divider. Furthermore, a suitable compensation network may be added at the output of the amplifier 112 to improve the transient response performance of the buck converter 101.

The power converter 104 is implemented as a current-mode switcher. The current-mode switcher includes a third switch Q3 and a fourth switch Q4 connected in series between VIN and ground, an inductor L2 connected between a common node of the third switch Q3 and the fourth switch Q4, and the output of the current-mode switcher, a PWM driver 140 configured to generate gate drive signals for the third switch Q3 and the fourth switch Q4. The current-mode switcher further comprises a current comparator 142 having an inverting input configured to receive a current sense signal proportional to a current flowing through the inductor L2, and non-inverting input connected to ground. Based upon the detected current signal, the current comparator 142 generates a control signal, which is fed into the PWM driver 140. Based on the control signal, the PWM driver 140 generates two gate signals for controlling the operation of switches Q3 and Q4. The operating principle of the current-mode switcher is well known in the art, and hence is not discussed in further detail to avoid repetition.

The linear amplifier 102 includes a fifth switch Q5 and a sixth switch Q6 connected in series between the first voltage rail V+ and the second voltage rail V−, and a comparator 406 configured to generate gate drive signals for the fifth switch Q5 and the sixth switch Q6. As shown in FIG. 5, an inverter input of the comparator 406 is configured to receive a predetermined reference VREF. A non-inverting input of the comparator 406 is connected to Vo. Based on the predetermined reference VREF and the detected output voltage, the comparator 406 generates two gate signals for controlling the operation of switches Q5 and Q6, respectively. More particularly, a sourcing current goes through the switch Q5, and a sinking current goes through the switch Q6. The sourcing current and the sinking current form the ripple current components of the linear amplifier 102, which are used to eliminate or almost eliminate the ripple current components generated by the power converter 104.

As shown in FIG. 5, the fifth switch Q5 is implemented as a p-type transistor. The sixth switch Q6 is implemented as an n-type transistor. It should be noted the p-type transistor and the n-type transistor are merely examples. A person skilled in the art would recognize there may be many variations, modifications and alternatives. For example, depending on different applications and design needs, the fifth switch Q5 may be implemented as an n-type transistor.

As shown in FIG. 5, the sinking converter 103 is implemented as a switched capacitor power converter. Throughout the description, sinking converter 103 may be alternatively referred to as the switched capacitor power converter 103. The switched capacitor power converter 103 comprises a seventh switch Q7, an eighth switch Q8, a ninth switch Q9, a tenth switch Q10, a capacitor C4 and an output capacitor C3. The capacitor C4 functions as a charge pump capacitor. Throughout the description, the capacitor C4 may be alternatively referred to as a charge pump capacitor.

As shown in FIG. 5, the seventh switch Q7, the eighth switch Q8, the ninth switch Q9 and the tenth switch Q10 are connected in series between the first voltage rail V+ and ground. The charge pump capacitor C4 is connected between a common node of the seventh switch Q7, the eighth switch Q8, and a common node of the ninth switch Q9 and the tenth switch Q10. The output capacitor C3 is connected between a common node of the eighth switch Q8 and the ninth switch Q9, and ground.

It should be noted while FIG. 5 shows the switches Q7 and Q8 are implemented as single p-type transistors, a person skilled in the art would recognize there may be many variations, modifications and alternatives. For example, depending on different applications and design needs, the switches Q7 and Q8 may be implemented as n-type transistors. Furthermore, each switch of the switched capacitor power converter 103 shown in FIG. 5 may be implemented as a plurality of switches connected in parallel. Moreover, a capacitor may be connected in parallel with one switch to achieve zero voltage switching (ZVS)/zero current switching (ZCS).

In some embodiments, the switched capacitor power converter 103 is configured to operate in a switching mode. The output voltage of the switched capacitor power converter 103 is equal to one half of the input voltage of the switched capacitor power converter 103. In other words, the voltage on the second voltage rail V− is equal to one half of the voltage on the first voltage rail V+.

In the switching mode, the switched capacitor power converter 103 functions as a charge pump power converter. The charge pump power converter may operate in two different phases. During a first phase of the switching mode, switches Q7 and Q9 are turned on, and switches Q8 and Q10 are turned off. Since switches Q7 and Q9 are turned on, a first conductive path is established between V+ and V−. The first conductive path is formed by switch Q7, the charge pump capacitor C4 and switch Q9. The current flows from V+ to V− through the first conductive path. During the first phase of the switching mode, the charge pump capacitor C4 is charged and energy is stored in the charge pump capacitor C4 accordingly.

During a second phase of the switching mode, switches Q7 and Q9 are turned off, and switches Q8 and Q10 are turned on. Since switches Q8 and Q10 are turned on, a second conductive path is established. The second conductive path is formed by switch Q10, the charge pump capacitor C4 and switch Q8. During the second phase of the switching mode, the current discharges the charge pump capacitor C4 and the energy stored in the charge pump capacitor C4 decreases accordingly.

In the switching mode, the switched capacitor power converter 103 functions as a charge pump power converter, which is a voltage divider. More particularly, by controlling the on/off time of the switches Q7-Q10, the output voltage of the switched capacitor power converter 103 is equal to one half of the input voltage of the switched capacitor power converter 103.

In accordance with an embodiment, the switches of FIG. 5 (e.g., switches Q1-Q10) may be metal oxide semiconductor field-effect transistor (MOSFET) devices. Alternatively, the switching element can be any controllable switches such as insulated gate bipolar transistor (IGBT) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices and the like.

Figure 6:
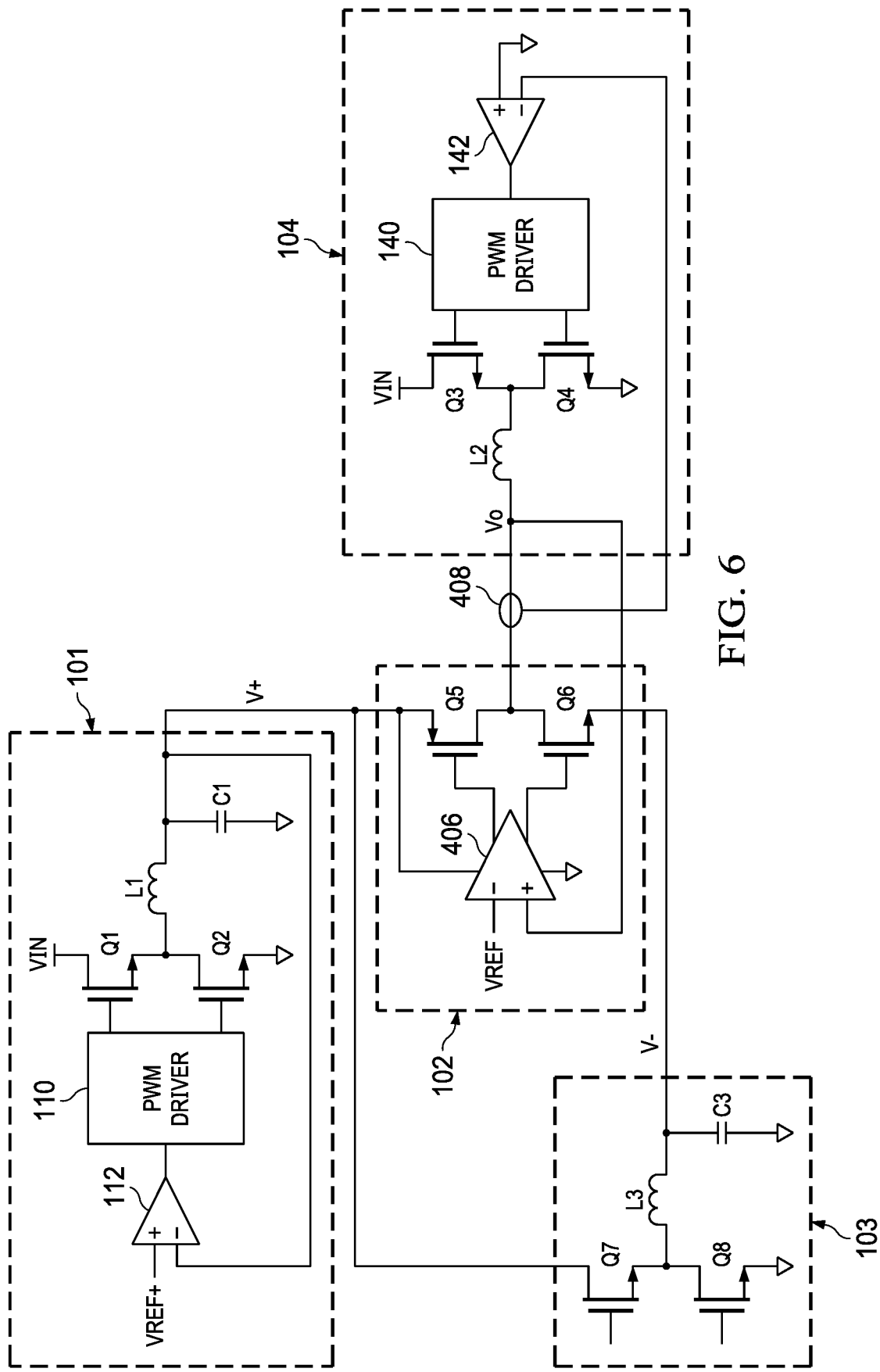
FIG. 6 illustrates a schematic diagram of a second implementation of the low noise power conversion system shown in FIG. 2 in accordance with various embodiments of the present disclosure.

FIG. 6 illustrates a schematic diagram of a second implementation of the low noise power conversion system shown in FIG. 2 in accordance with various embodiments of the present disclosure. The low noise power conversion system shown in FIG. 6 is similar to the low noise power conversion system shown in FIG. 5 except that the sinking converter 103 is implemented as a buck converter. The buck converter (sinking converter 103) comprises switches Q7 and Q8 connected in series between V+ and ground, and an inductor L3 connected between a common node of Q7 and Q8, and the output capacitor C3.

In some embodiments, the sinking converter 103 shown in FIG. 6 operates at a fixed duty cycle such as 50%. As a result of having a 50% duty cycle, the output voltage of the sink converter 103 is equal to one half of the input voltage (V+). Since the output of the sinking converter 103 is connected to the second voltage rail V− and the input of the sinking converter 103 is connected to the first voltage rail V+, the voltage on the second voltage rail V− is about one half of the voltage on the first voltage rail V+. In alternative embodiments, the sinking converter 103 shown in FIG. 6 operates at an adjustable duty cycle. Depending on various operating conditions, the voltage on the second voltage rail V− may be dynamically adjustable, thereby reducing the power losses of the linear amplifier 102.

Figure 7:
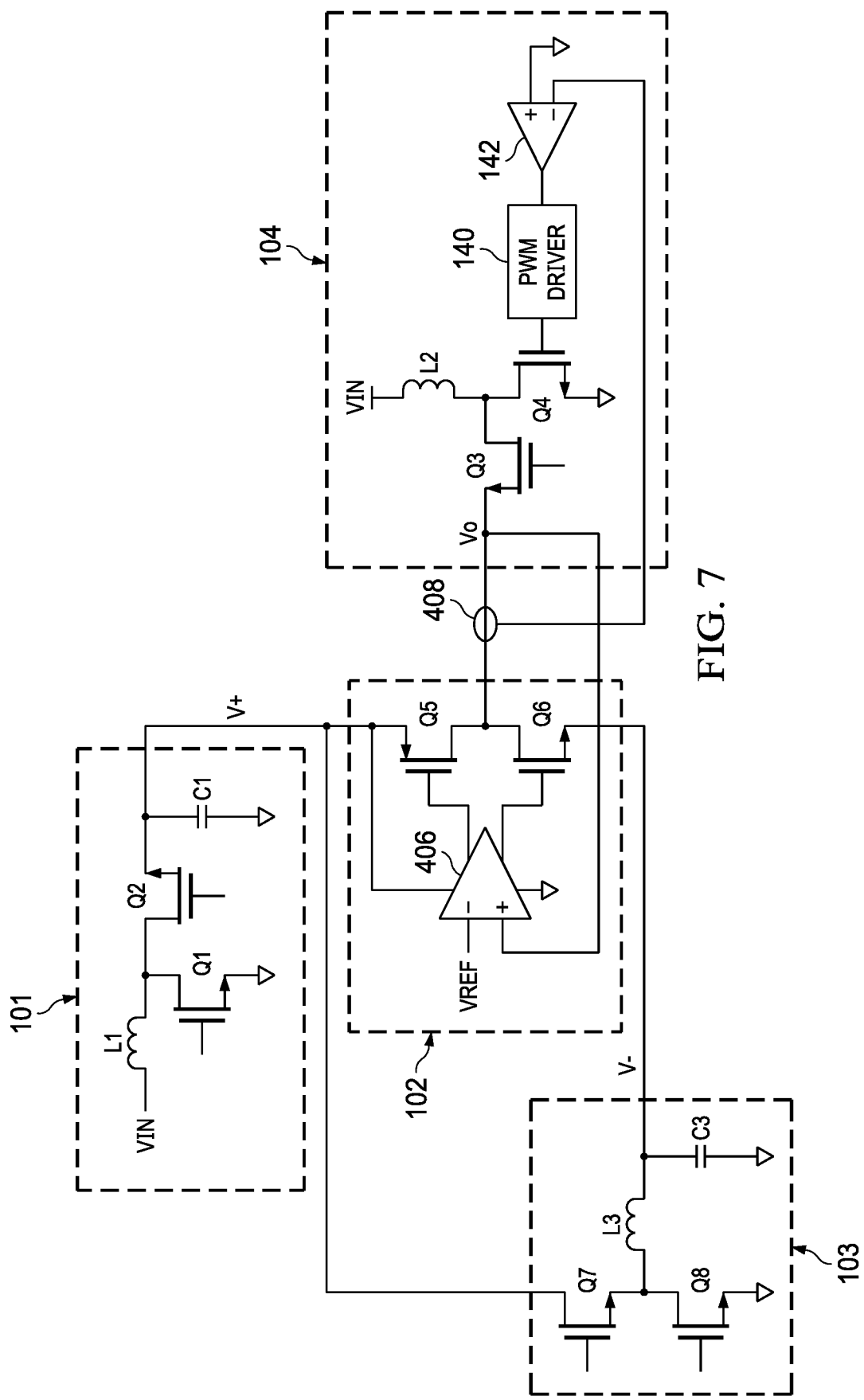
FIG. 7 illustrates a schematic diagram of a third implementation of the low noise power conversion system shown in FIG. 2 in accordance with various embodiments of the present disclosure.

FIG. 7 illustrates a schematic diagram of a third implementation of the low noise power conversion system shown in FIG. 2 in accordance with various embodiments of the present disclosure. The low noise power conversion system shown in FIG. 7 is similar to the low noise power conversion system shown in FIG. 6 except that the sourcing converter 101 and the power converter 104 are implemented as boost converters respectively.

As shown in FIG. 7, the sourcing converter 101 comprises a first switch Q1, a second switch Q2, an inductor L1 and an output capacitor C1. The switches Q2 and Q2 are connected in series between V+ and ground. The inductor L1 is connected between the input of the sourcing converter 101 and a common node of Q1 and Q2. The sourcing converter 101 is a boost converter, which is used to provide an output voltage higher than an input voltage by modulating the width of a pulse applied to the switch Q1. The operation principles of the boost converter are well known in the art, and hence are not discussed in further detail herein.

The power converter 104 comprises a third switch Q3, a fourth switch Q4 and an inductor L2. The switches Q3 and Q4 are connected in series between Vo and ground. The inductor L2 is connected between VIN and a common node of Q3 and Q4. The power converter 104 is a boost converter, which is used to provide an output voltage higher than an input voltage by modulating the width of a pulse applied to the switch Q4. The operation principles of the boost converter are well known in the art, and hence are not discussed in further detail herein.

One advantageous feature of having the boost converters shown in FIG. 7 is the low noise power conversion system is suitable for step-up applications. The power converter 104 is able to convert the input voltage to a higher voltage. The linear amplifier 102 is able to eliminate or almost eliminate the ripple components generated by the power converter 104.

Figure 8:
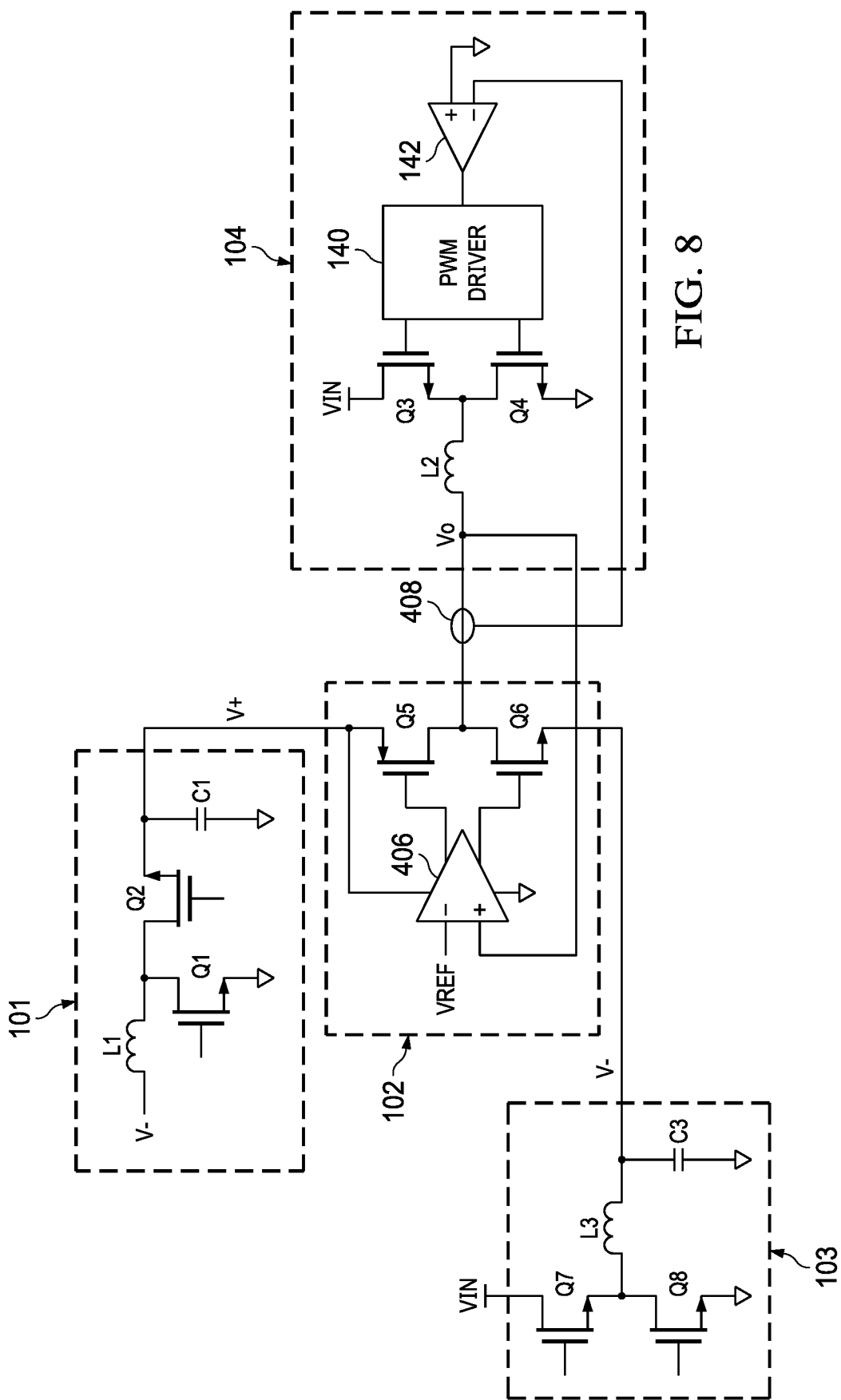
FIG. 8 illustrates a schematic diagram of a fourth implementation of the low noise power conversion system shown in FIG. 2 in accordance with various embodiments of the present disclosure.

FIG. 8 illustrates a schematic diagram of a fourth implementation of the low noise power conversion system shown in FIG. 2 in accordance with various embodiments of the present disclosure. The low noise power conversion system shown in FIG. 8 is similar to the low noise power conversion system shown in FIG. 6 except that the sourcing converter is implemented as a boost converter.

As shown in FIG. 8, the input of the sinking converter 103 is connected to VIN. The sinking converter 103, as a buck converter, is configured to convert VIN to a lower voltage such as 1.2 V. The sourcing converter 101 has an input connected to the second voltage rail V− and an output connected to the first voltage rail V+. The sourcing converter 101, as a boost converter, is configured to convert the lower voltage on the second voltage rail V− to a higher voltage such as 2.4 V.

In some embodiments, the sourcing converter 101 shown in FIG. 8 operates at a fixed duty cycle such as 50%. As a result of having a 50% duty cycle, the output voltage of the sourcing converter 101 is equal to two times the input voltage. In alternative embodiments, the sourcing converter 101 shown in FIG. 8 operates at an adjustable duty cycle. Depending on various operating conditions, the voltage on the first voltage rail V+ may be dynamically adjustable, thereby reducing the power losses of the linear amplifier 102. Furthermore, the sinking converter 103 shown in FIG. 8 operates at an adjustable duty cycle. The voltage on the second voltage rail V− may be dynamically adjustable, thereby reducing the power losses of the linear amplifier 102.

It should be noted that the duty cycle of the sinking converter 103 and the duty cycle of the sourcing converter 101, either individually or in combination, are dynamically adjustable. As a result, the voltage on the first voltage rail V+ and/or the voltage on the second voltage rail V− may be dynamically adjustable, thereby reducing the voltage variation range of the linear amplifier 102 so as to reduce the power losses of the linear amplifier 102.

Figure 9:
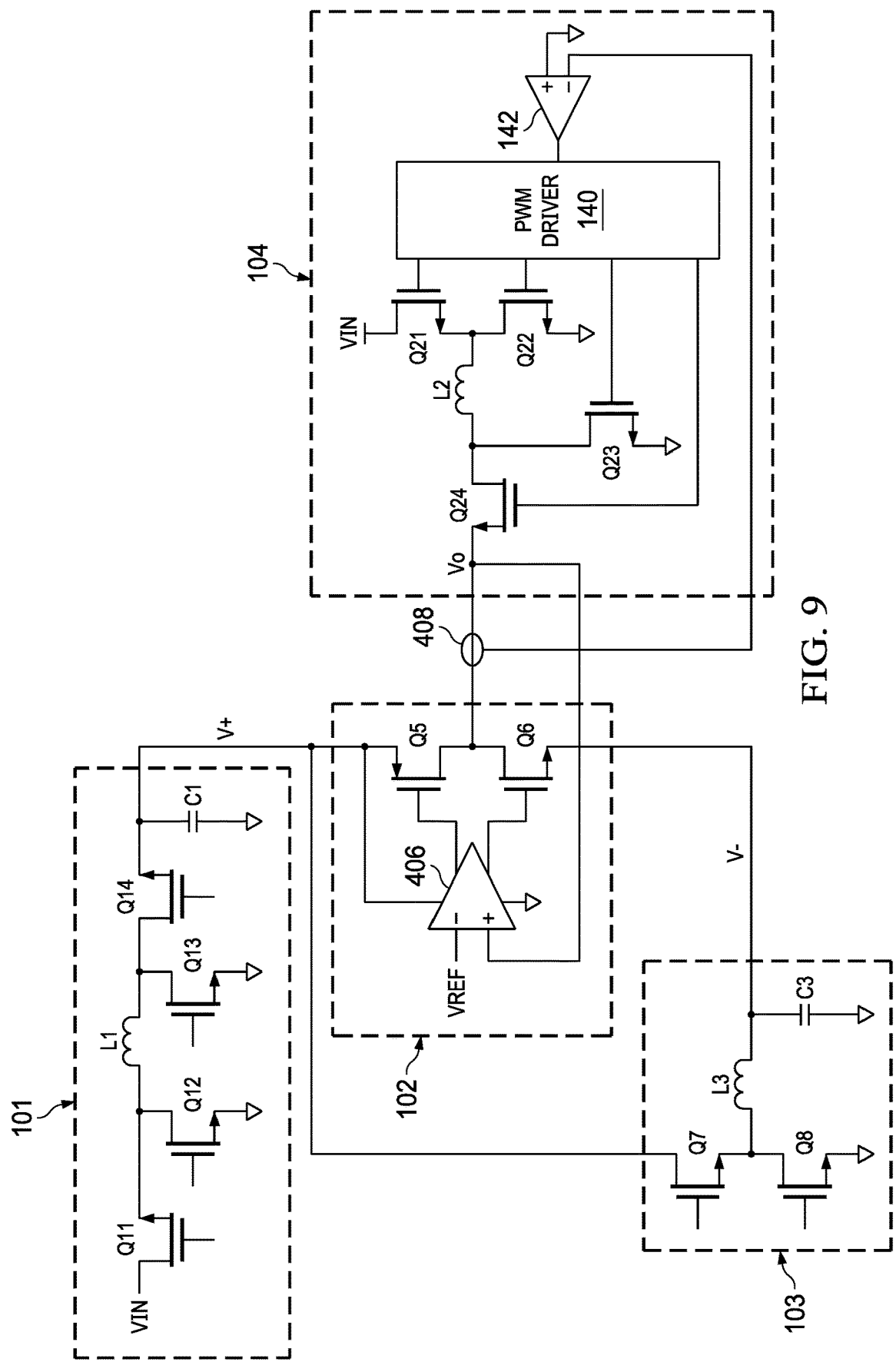
FIG. 9 illustrates a schematic diagram of a fifth implementation of the low noise power conversion system shown in FIG. 2 in accordance with various embodiments of the present disclosure.

FIG. 9 illustrates a schematic diagram of a fifth implementation of the low noise power conversion system shown in FIG. 2 in accordance with various embodiments of the present disclosure. The low noise power conversion system shown in FIG. 9 is similar to the low noise power conversion system shown in FIG. 6 except that both the sourcing converter 101 and the power converter 104 are implemented as buck-boost converters respectively.

As shown in FIG. 9, the sourcing converter 101 comprises switches Q11, Q12, Q13, Q14 and an inductor L1, which form a buck-boost converter. The buck-boost converter (sourcing converter 101) may operate in three different operating modes, a step-up mode, a step-down mode and a buck-boost mode. When the buck-boost converter operates in a step-up mode, the switch Q11 is configured as an always-on switch, and the switch Q12 is configured as an always-off switch. As a result, the inductor L1 and the switches Q13, Q14 form a boost converter. On the other hand, when the buck-boost converter operates in a step-down mode, the switch Q14 is configured as an always-on switch, and the switch Q13 is configured as an always-off switch. As a result, the switches Q11, Q12 and the inductor L1 form a buck converter. Furthermore, the buck-boost converter may operate in a buck-boost mode when the input voltage is approximately equal to the output voltage of the sourcing converter 101. In the buck-boost mode, switches Q11-Q14 are turned on and off based on the detected input voltage and output voltage signals. The operating principle of the buck-boost converter is well known in the art, and hence is not discussed in further detail to avoid unnecessary repetition.

The power converter 104 comprises switches Q21, Q22, Q23, Q24 and an inductor L2. Switches Q21, Q22, Q23, Q24, the inductor L2, the current comparator 142 and the PWM driver 140 form a current-mode buck-boost converter. The operating principle of the current-mode buck-boost converter is well known in the art, and hence is not discussed in further detail to avoid unnecessary repetition.

One advantageous feature of having the buck-boost converters shown in FIG. 9 is the low noise power conversion system is suitable for both step-down and step-up applications. The power converter 104 is able to convert the input voltage to either a lower voltage or a higher voltage. The linear amplifier 102 is able to eliminate or almost eliminate the ripple components generated by the power converter 104.

Figure 10:
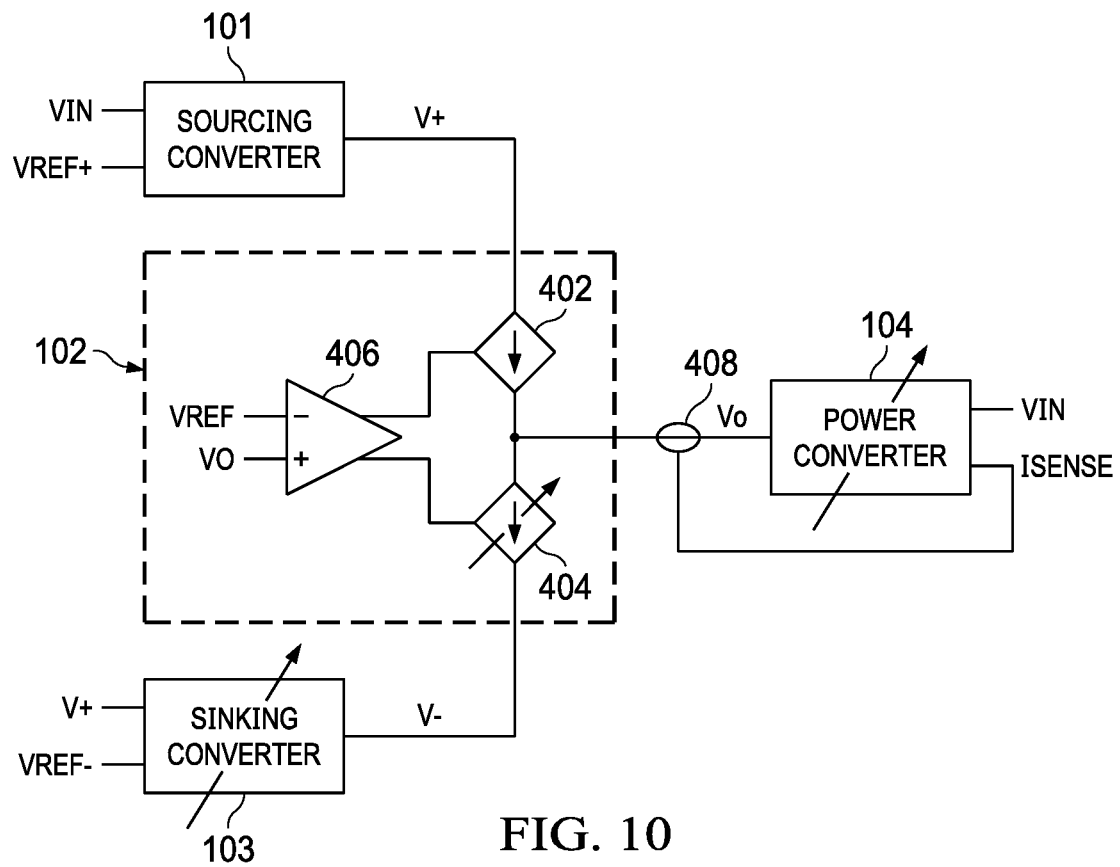
FIG. 10 illustrates a block diagram of the low noise power conversion system shown in FIG. 4 operating in low power conditions in accordance with various embodiments of the present disclosure.

FIG. 10 illustrates a block diagram of the low noise power conversion system shown in FIG. 4 operating in low power conditions in accordance with various embodiments of the present disclosure. As shown in FIG. 10, the current flowing out of the power converter 104 is sensed by a current sensor 408. When the current flowing out of the power converter 104 is below a certain threshold, a low power condition is asserted. Under the low power condition, the power converter 104 is disabled as indicated by the arrow placed on the symbol of the power converter 104. Once the power converter 104 is disabled, the switches of the power converter 104 are tri-stated. Likewise, the sinking leg 404 of the linear amplifier 102 is also disabled as indicated by the arrow placed on the symbol of the sinking leg 404. Furthermore, the sinking converter 103 is also disabled as indicated by the arrow placed on the symbol of the sinking converter 103. Through disabling the power converter 104, the sinking leg 404 and the sinking converter 103, the power losses from the power converter 104, the sinking leg 404 and the sinking converter 103 are saved.

It should be noted that after the power converter 104, the sinking leg 404 and the sinking converter 103 have been disabled, the low noise power conversion system shown in FIG. 10 becomes a switching converter followed by an LDO. The sourcing converter 101 functions as a switching converter, and the sourcing leg 402 functions as an LDO. The switching converter and the LDO connected in cascade can provide relatively good efficiency under light load conditions by applying suitable power saving control schemes such as pulse skipping, burst mode or pulse frequency modulation (PFM) types of control mechanisms to the sourcing converter 101. In addition, the LDO is able to attenuate noise to satisfy the requirements of the noise sensitive load connected to Vo.

It should further be noted that in the low power conditions, the voltage on the first voltage rail V+ may be regulated at a different voltage level to further improve the efficiency of the low noise power conversion system. As described above, in the low power conditions the sourcing leg 402 functions as an LDO. In order to improve the efficiency of the LDO, the voltage on the first voltage rail V+ may be set slight lower to reduce the voltage drop on the LDO.

Figure 11:
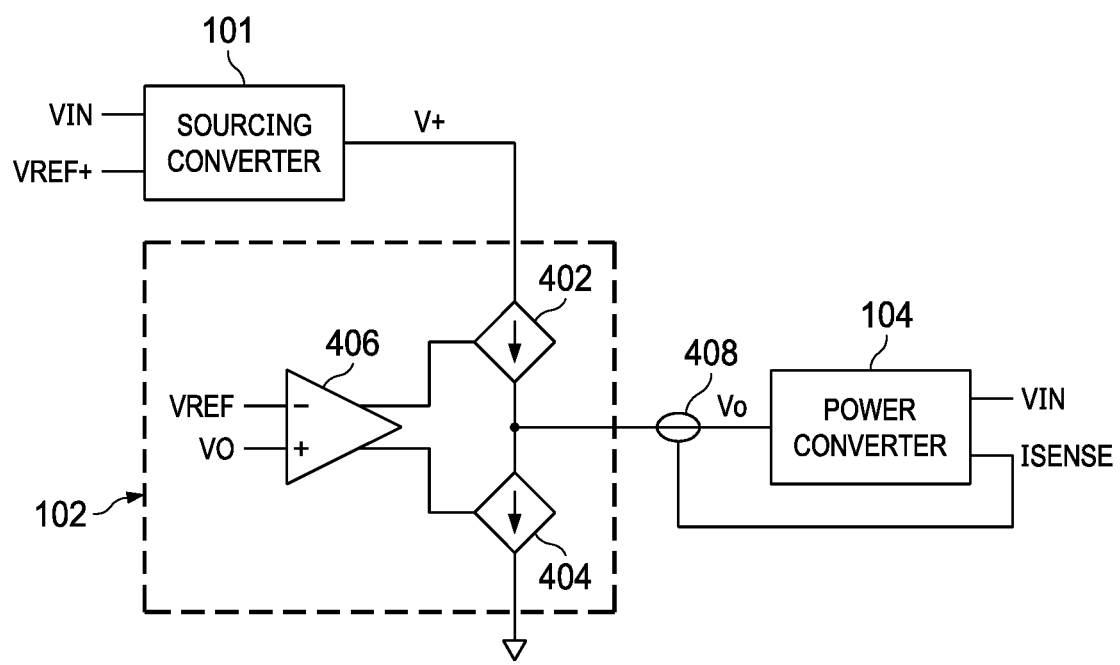
FIG. 11 illustrates a block diagram of a low noise power conversion system including only a sourcing power converter in accordance with various embodiments of the present disclosure.

FIG. 11 illustrates a block diagram of a low noise power conversion system including only a sourcing power converter in accordance with various embodiments of the present disclosure. The low noise power conversion system shown in FIG. 11 is similar to the low noise power conversion system shown in FIG. 4 except that the second voltage rail of the linear amplifier 102 is connected to ground directly.

In certain applications, if the sourcing leg 402 of the linear amplifier 102 has a significantly more loss than that of the sinking leg 404, or the loss from the sinking leg 404 is not significant from the system efficiency point of view, it might be advantageous to include only the sourcing converter 101 as shown in FIG. 11.

Under low power conditions, the low noise power conversion system shown in FIG. 11 can be handled similarly as the low noise power conversion system shown in FIG. 10. For saving unnecessary power losses, the power converter 104 and the sinking leg 404 may be disabled when the low noise power conversion system operates in low power conditions.

Figure 12:
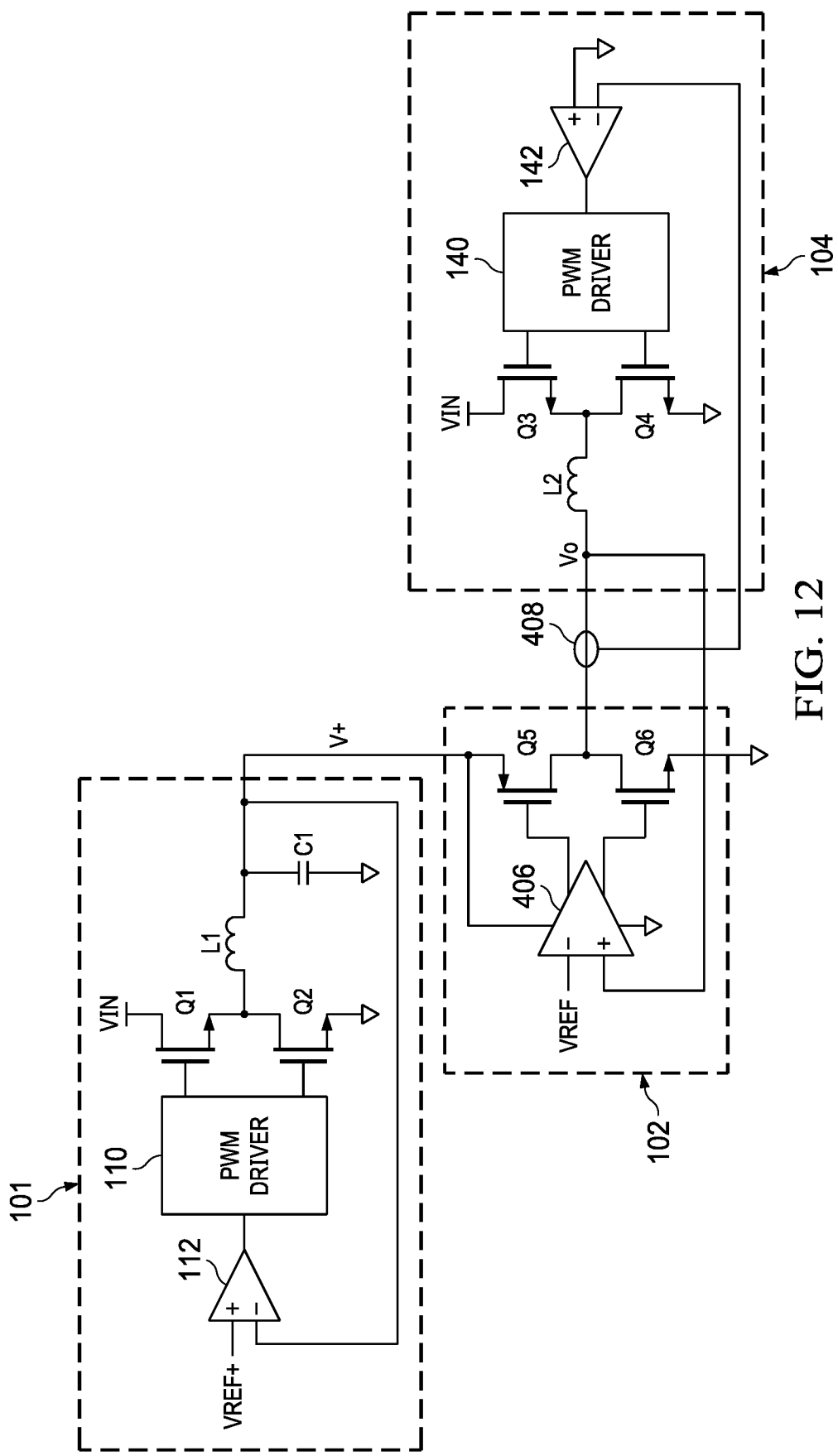
FIG. 12 illustrates a schematic diagram of the low noise power conversion system shown in FIG. 11 in accordance with various embodiments of the present disclosure.

FIG. 12 illustrates a schematic diagram of the low noise power conversion system shown in FIG. 11 in accordance with various embodiments of the present disclosure. The low noise power conversion system shown in FIG. 12 is similar to the low noise power conversion system shown in FIG. 5 except that the second rail of the linear amplifier 102 is connected to ground directly.

It should be noted that the various embodiments shown FIGS. 6-9 are applicable to the low noise power conversion system shown in FIG. 12. For example, the sourcing converter 101 shown in FIG. 12 may be replaced by any suitable power converters such as boost converter, buck-boost converters, any combinations thereof and the like.

Figure 13:
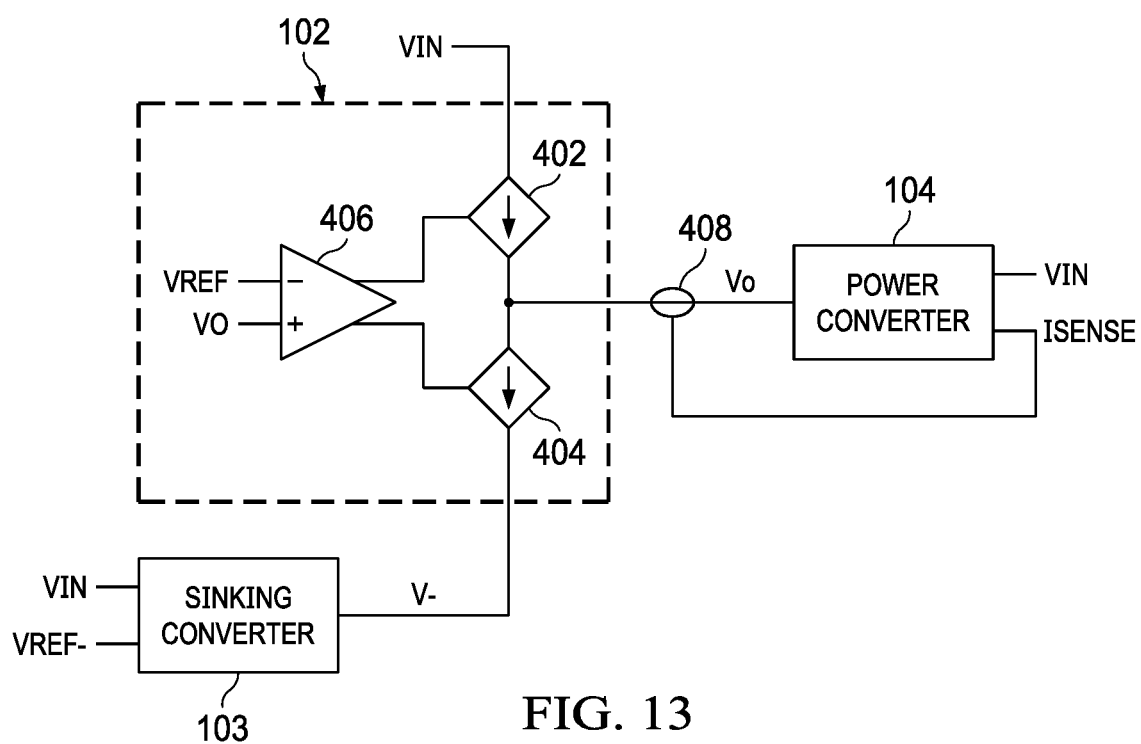
FIG. 13 illustrates a block diagram of a low noise power conversion system including only a sinking power converter in accordance with various embodiments of the present disclosure.

FIG. 13 illustrates a block diagram of a low noise power conversion system including only a sinking power converter in accordance with various embodiments of the present disclosure. The low noise power conversion system shown in FIG. 13 is similar to the low noise power conversion system shown in FIG. 4 except that the first voltage rail of the linear amplifier 102 is connected to VIN directly.

In certain applications, if the sinking leg 404 of the linear amplifier 102 has a significantly more loss than that of the sourcing leg 402, or the loss from the sourcing leg 402 is not significant from the system efficiency point of view, it might be advantageous to include only the sinking converter 103 as shown in FIG. 13.

Under low power conditions, the low noise power conversion system shown in FIG. 13 can be handled similarly as the low noise power conversion system shown in FIG. 10. For saving unnecessary power losses, the power converter 104, the sinking converter 103 and the sinking leg 404 may be disabled. In this low power conditions, the low noise power conversion system shown in FIG. 13 behaves as an LDO. In particular, the sourcing leg 402 functions as an LDO.

Figure 14:
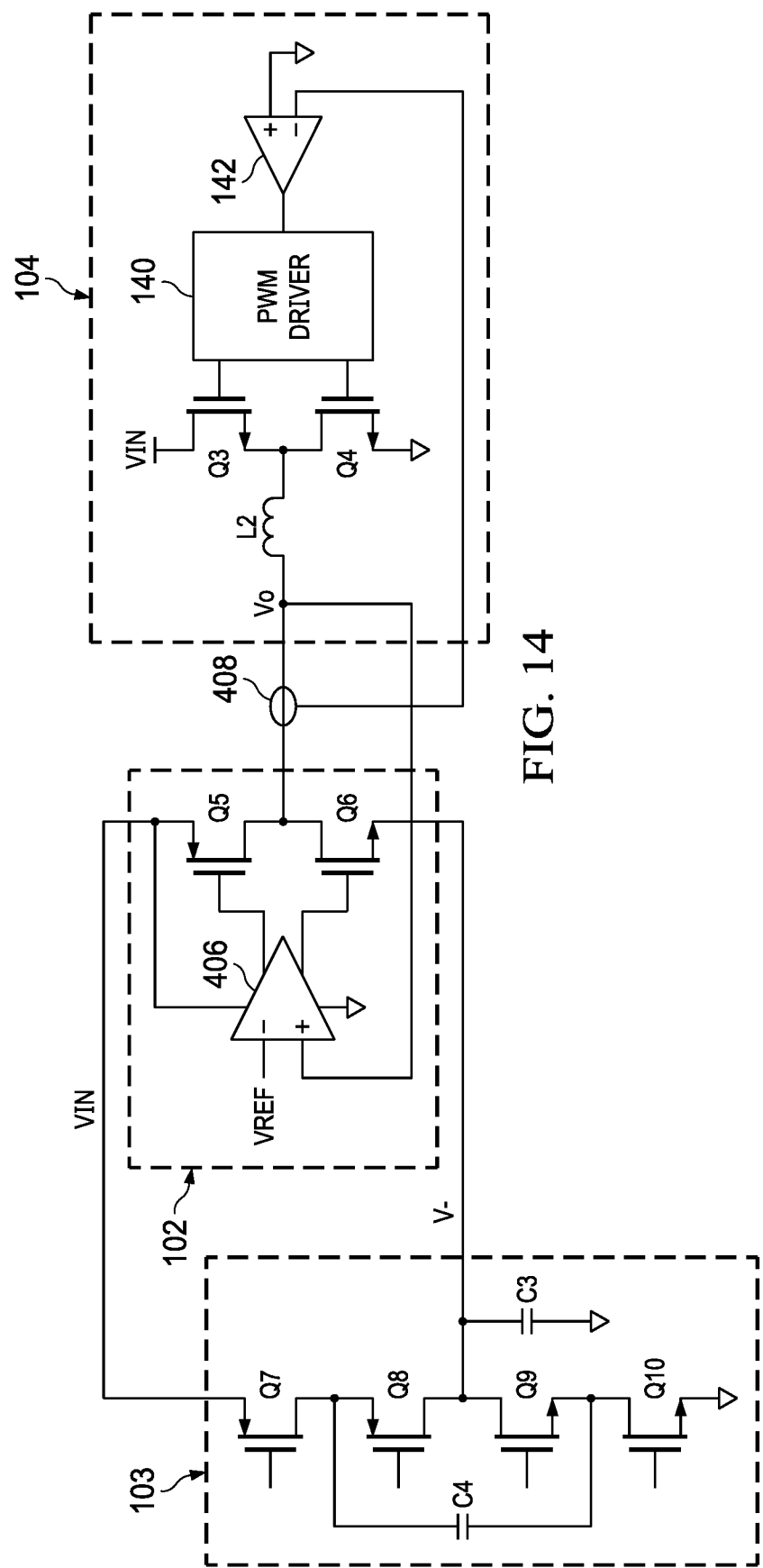
FIG. 14 illustrates a schematic diagram of the low noise power conversion system shown in FIG. 13 in accordance with various embodiments of the present disclosure.

FIG. 14 illustrates a schematic diagram of the low noise power conversion system shown in FIG. 13 in accordance with various embodiments of the present disclosure. The low noise power conversion system shown in FIG. 14 is similar to the low noise power conversion system shown in FIG. 5 except that the first rail of the linear amplifier is connected to VIN directly. In some embodiments, VIN is equal to 2.5 V. Vo is equal to 1.8 V. The sinking converter 103 converts VIN to a voltage approximately equal to 1.25 V, which is used to supply the second voltage rail V− of the linear amplifier 102.

It should be noted that the various embodiments shown FIGS. 6-9 are applicable to the low noise power conversion system shown in FIG. 14. For example, the sinking converter 103 shown in FIG. 14 may be replaced by any suitable power converters such as buck converters, boost converter, buck-boost converters, any combinations thereof and the like.

Figure 15:
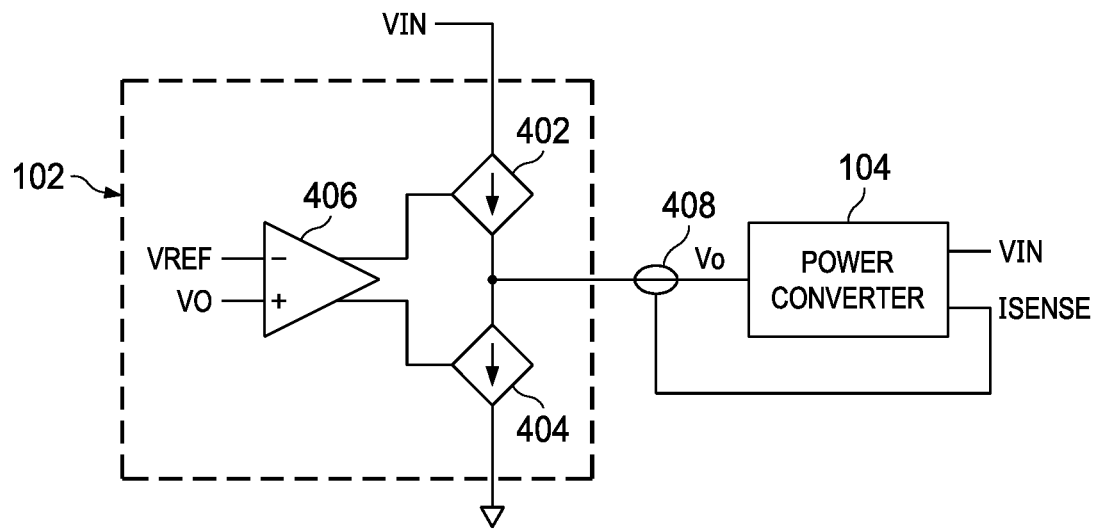
FIG. 15 illustrates a block diagram of another low noise power conversion system in accordance with various embodiments of the present disclosure.

FIG. 15 illustrates a block diagram of another low noise power conversion system in accordance with various embodiments of the present disclosure. The low noise power conversion system shown in FIG. 15 is similar to the low noise power conversion system shown in FIG. 5 except that the first rail of the linear amplifier is connected to VIN directly, and the second voltage rail of the linear amplifier is connected to ground directly.

Figure 16:
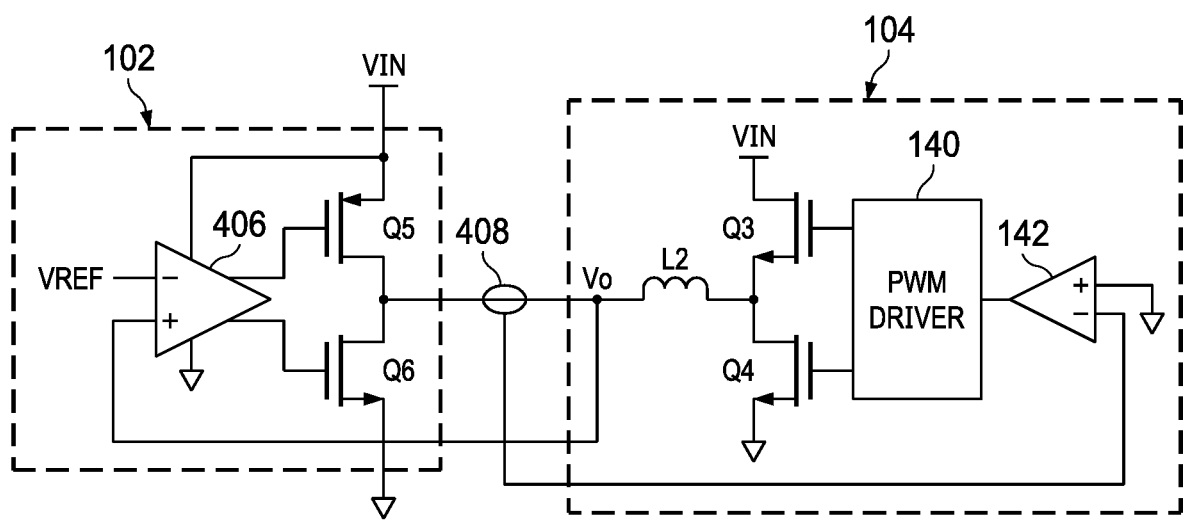
FIG. 16 illustrates a schematic diagram of the low noise power conversion system shown in FIG. 15 in accordance with various embodiments of the present disclosure.

FIG. 16 illustrates a schematic diagram of the low noise power conversion system shown in FIG. 15 in accordance with various embodiments of the present disclosure. As shown in FIG. 16, the linear amplifier 102 comprises switches Q5 and Q6 are connected in series between VIN and ground. The low noise power conversion system shown in FIG. 16 is suitable for low voltage applications. For example, when the input voltage is about 2.5 V, it is not necessary to have the sourcing converter and the sinking converter described above to further reduce the power losses of the linear amplifier 102.

Figure 17:
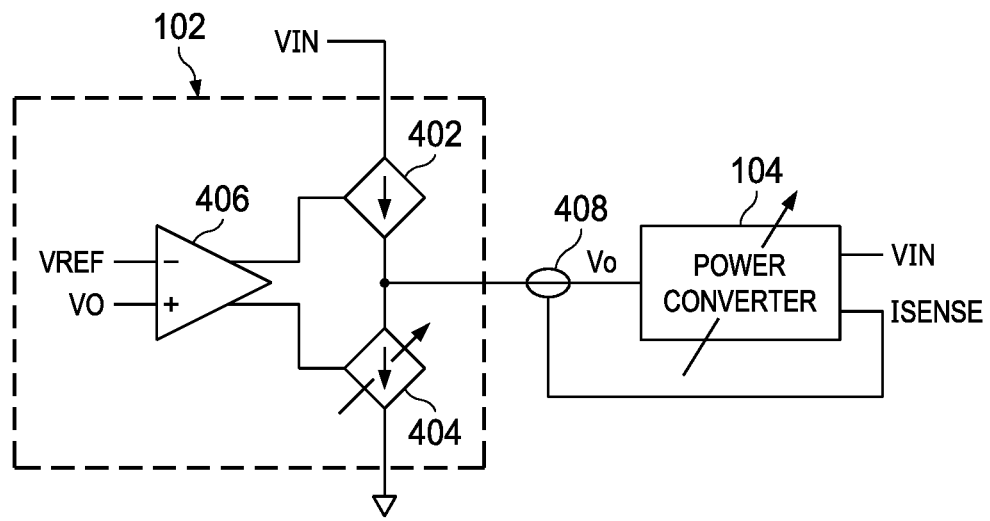
FIG. 17 illustrates a block diagram of the low noise power conversion system shown in FIG. 15 operating in low power conditions in accordance with various embodiments of the present disclosure.

FIG. 17 illustrates a block diagram of the low noise power conversion system shown in FIG. 15 operating in low power conditions in accordance with various embodiments of the present disclosure. Under low power conditions, the low noise power conversion system shown in FIG. 17 can be handled similarly as the low noise power conversion system shown in FIG. 10. For saving unnecessary power losses, the power converter 104 and the sinking leg 404 may be disabled. In this low power conditions, the low noise power conversion system shown in FIG. 17 behaves as an LDO. In particular, the sourcing leg 402 functions as an LDO.

It should be noted that under the low power conditions, the sourcing leg 402 of the linear amplifier 102 may be configured to operate in a bypass mode to further reduce the power losses of the linear amplifier 102. In the bypass mode, the switch of the sourcing leg 402 stops switching and becomes an always-on switch, thereby reducing the power losses of the sourcing leg 402.

Figure 18:
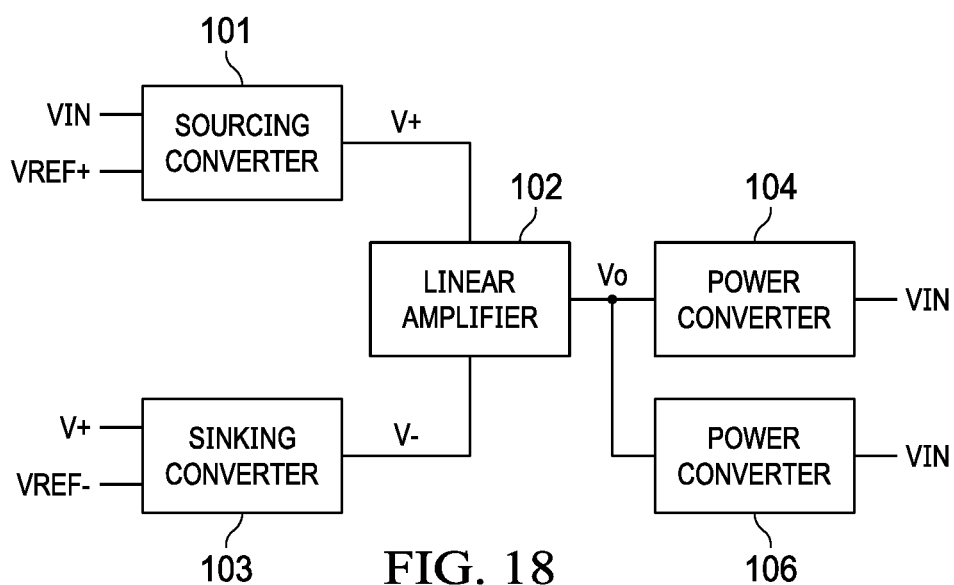
FIG. 18 illustrates a block diagram of another low noise power conversion system in accordance with various embodiments of the present disclosure.

FIG. 18 illustrates a block diagram of another low noise power conversion system in accordance with various embodiments of the present disclosure. The low noise power conversion system shown in FIG. 18 is similar to the low noise power conversion system shown in FIG. 5 except that two power converters are employed to generate the output voltage Vo for the noise sensitive load.

As shown in FIG. 18, a first power converter 104 and a second power converter 106 are connected in parallel between VIN and Vo. In some embodiments, the first power converter 104 is a slow buck converter, and the second power converter 106 a fast buck converter for delivering power from VIN to Vo. The slow buck converter 104 operates at a low frequency and has a large inductor, and large power switches, while the fast buck converter 106 operates at a high switching frequency and has a small inductor and small power switches. The purpose of these two buck converters is to use the fast buck converter for improving the load transient response, and to eliminate the large ripple current generated by the slow buck converter, and the linear amplifier 102 is used to eliminate the smaller ripple current generated by the fast buck converter. The control of these two buck converters may be any suitable control schemes such as nested current-mode control. Applying a nested current-mode control scheme to a buck converter is well known in the art, and hence is not discussed herein.

Figure 19:
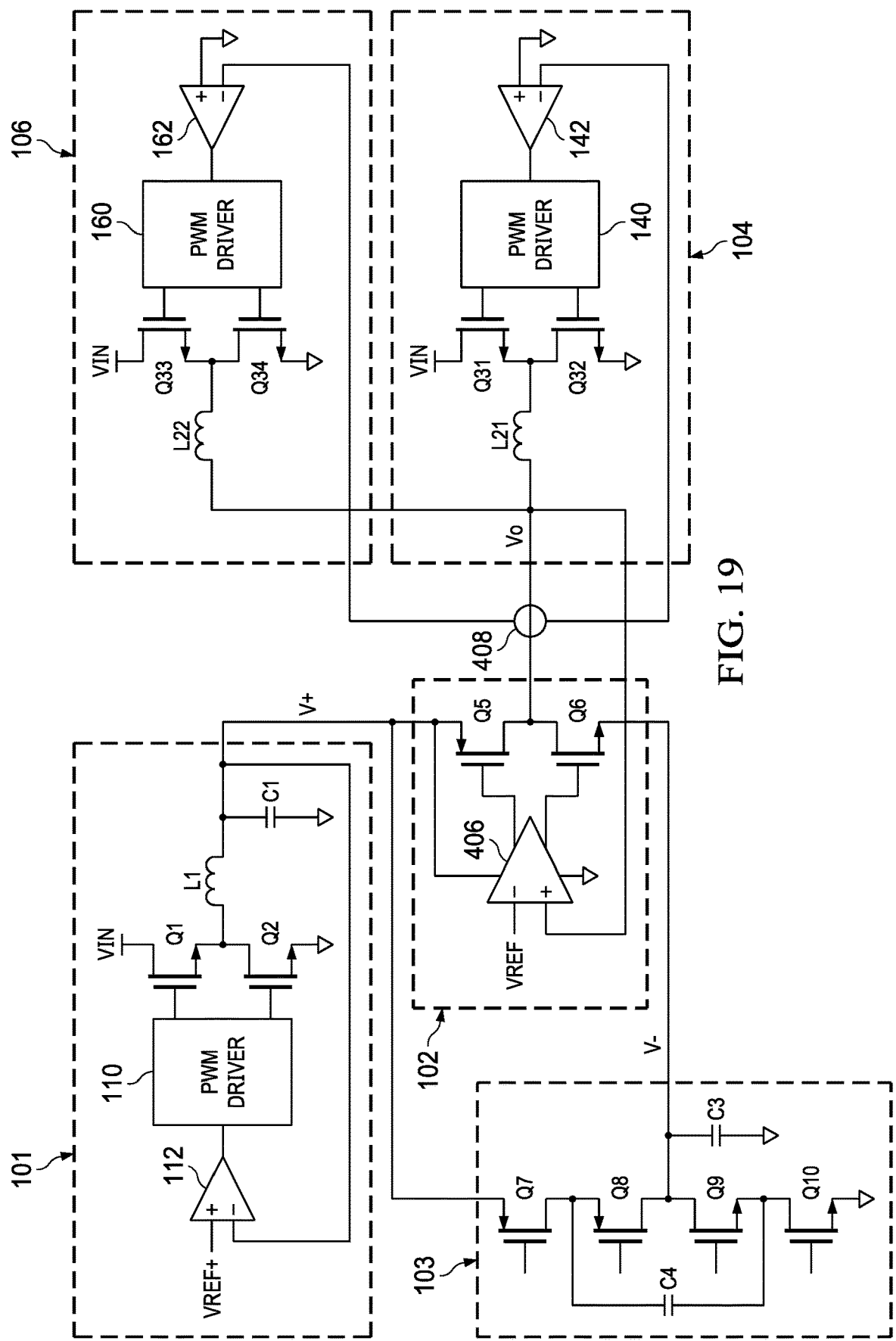
FIG. 19 illustrates a schematic diagram of the low noise power conversion system shown in FIG. 18 in accordance with various embodiments of the present disclosure.

FIG. 19 illustrates a schematic diagram of the low noise power conversion system shown in FIG. 18 in accordance with various embodiments of the present disclosure. As shown in FIG. 19, a first power converter 104 and a second power converter 106 are connected in parallel between VIN and Vo. The first power converter 104 comprises Q31, Q32, inductor L21, PWM driver 140 and current comparator 142. The second power converter 106 comprises Q33, Q34, inductor L22, PWM driver 160 and current comparator 162. Both the first power converter 104 and the second power converter 106 are implemented as buck converters. The operating principle of the buck converters have been described above with respect to FIG. 5, and hence is not discussed again.

It should be noted that the various embodiments shown FIGS. 6-9 are applicable to the low noise power conversion system shown in FIG. 19. For example, the sinking converter 103 shown in FIG. 19 may be replaced by any suitable power converters such as buck converters, boost converter, buck-boost converters, any combinations thereof and the like. Likewise, the sourcing converter 101 shown in FIG. 19 may be replaced by any suitable power converters such as buck converters, boost converter, buck-boost converters, any combinations thereof and the like.

It should further be noted that the second power converter 106 helps to reduce the size of switches Q5 and Q6. As described above, the fast buck converter helps to reduce the ripple current components generated by the low buck converter. The linear amplifier is employed to eliminate or almost eliminate the ripple current components of the fast buck converter. Since the fast buck converter operates at a higher switching frequency, the ripple current components of the fast buck converter are relatively small. As a result, the switches Q5 and Q5 can be implemented as small switches for eliminating the ripple current components generated by the fast buck converter.

Figure 20:
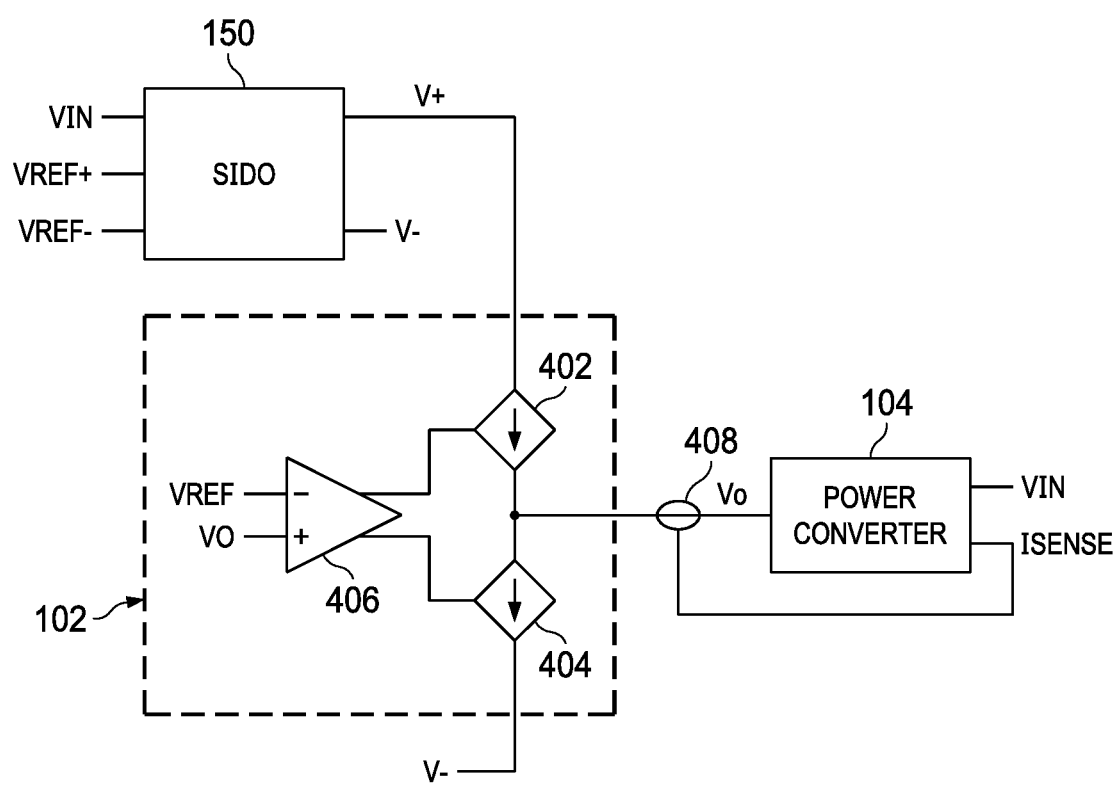
FIG. 20 illustrates a block diagram of another low noise power conversion system in accordance with various embodiments of the present disclosure.

FIG. 20 illustrates a block diagram of another low noise power conversion system in accordance with various embodiments of the present disclosure. The low noise power conversion system shown in FIG. 20 is similar to the low noise power conversion system shown in FIG. 5 except that the voltages on the first voltage rail V+ and the second voltage rail V− are supplied by a single-inductor-dual-output (SIDO) power converter 150.

As shown in FIG. 20, the SIDO power converter 150 has an input connected to VIN. The SIDO power converter 150 is configured to receive a first reference signal VREF+ and a second reference signal VREF−. The first reference signal VREF+ is employed to set the voltage of V+. The second reference signal VREF− is employed to set the voltage of V−. As shown in FIG. 20, V+ is the first voltage rail of the linear amplifier 102. V− is the second voltage rail of the linear amplifier 102.

Figure 21:
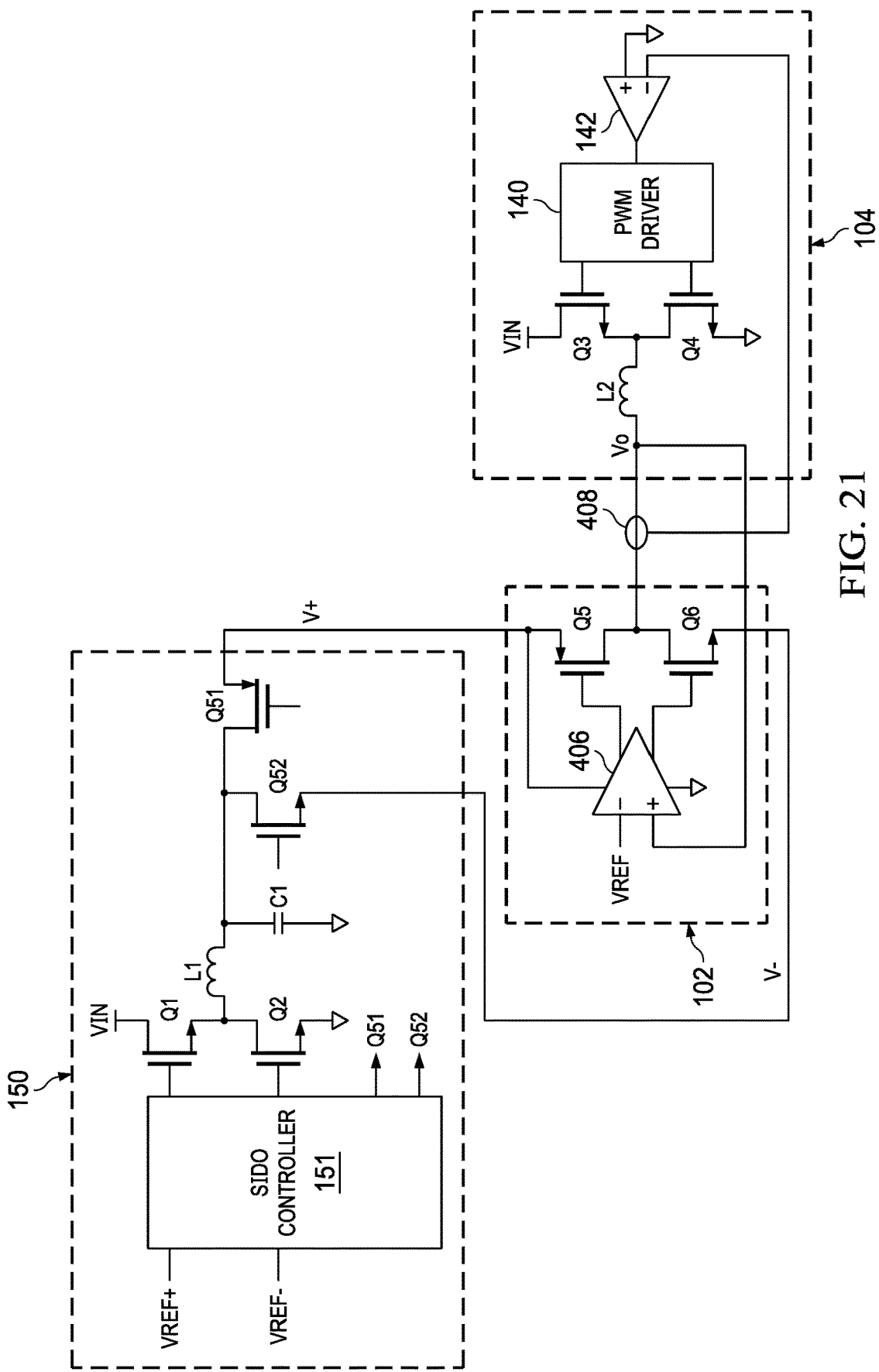
FIG. 21 illustrates a schematic diagram of the low noise power conversion system shown in FIG. 20 in accordance with various embodiments of the present disclosure.

FIG. 21 illustrates a schematic diagram of the low noise power conversion system shown in FIG. 20 in accordance with various embodiments of the present disclosure. The SIDO power converter 150 comprises switches Q1, Q2, Q51, Q52, an inductor L1 and an output capacitor C1. As shown in FIG. 21, switches Q1, Q2, the inductor L1 and the output capacitor C1 form a buck converter. Q51 is connected between the output of the buck converter and V+. Q52 is connected between the output of the buck converter and V−. An SIDO controller 151 is configured to receive the reference signals VREF+ and VREF−. Based on the reference signals VREF+ and VREF−, the SIDO controller 151 generates gate drive signals for controlling Q1, Q2, Q51 and Q52 as shown in FIG. 21.

V+ is a sourcing terminal, and V− is a sinking terminal. The load currents flowing through Q51 and Q52 have opposite directions. The SIDO controller 151 controls the operation of Q51 to regulate the voltage on the first voltage rail V+. Likewise, the SIDO controller 151 controls the operation of Q52 to regulate the voltage on the first voltage rail V−.

It should be noted that the various power saving control mechanisms described above (e.g., control mechanism shown in FIG. 10) are applicable to the low noise power conversion system shown in FIG. 21. For example, under light load operating conditions, the switches Q52, Q6, and the power converter 104 may be disabled for reducing power losses.

It should further be noted that depending on different applications and design needs, the SIDO power converter shown in FIG. 21 may be replaced by a single-inductor-multiple-output (SIMO) power converter.

In the embodiments shown in FIGS. 4-21, the input of the power converter 104 (current-mode switcher) is connected to VIN. This connection is merely an example. One of ordinary skill in the art would recognize many variations, alternatives, and modifications. For example, depending on different applications and design needs, the input of the power converter 104 can be connected to the first voltage rail V+.

In the embodiments shown in FIGS. 1-21, the current comparator 142 may be implemented as a hysteresis comparator. The hysteresis of the current comparator 142 helps to set an upper threshold and a lower threshold to eliminate the multiple transitions caused by noise or signal variations.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. The specification and drawings are, accordingly, to be regarded simply as an illustration of the disclosure as defined by the appended claims, and are contemplated to cover any and all modifications, variations, combinations or equivalents that fall within the scope of the present disclosure.

What is claimed is:

1. A system comprising:
   a current-mode switcher configured to provide a direct current (DC) voltage for a noise sensitive load; and
   a linear amplifier connected to an output of the current-mode switcher, wherein the linear amplifier is powered by a first voltage rail and a second voltage rail, and the first voltage rail is connected to an output of a sourcing power converter connected to a power source, and the second voltage rail is connected to an output of a sinking power converter, and the linear amplifier is configured to draw a reduced supply voltage through reducing a voltage on the first voltage rail and increasing a voltage on the second voltage rail,
   wherein an input of the sinking power converter is directly connected to the output of the sourcing power converter,
   wherein the linear amplifier is configured to reduce ripple current components generated by the current-mode switcher,
   wherein the sourcing power converter and the sinking power converter are configured to reduce a supply voltage of the linear amplifier,
   wherein the sourcing power converter is a buck power converter connected between the power source and the first voltage rail of the linear amplifier, and
   wherein the sinking power converter is a switched-capacitor power converter configured as a 2:1 step-down power converter having an input connected to an output of the buck power converter.

2. The system of claim 1, wherein the current-mode switcher includes:
   a first switch and a second switch connected in series;
   an inductor connected between the output of the current-mode switcher and a common node of the first switch and the second switch;
   a pulse width modulation (PWM) driver configured to generate gate drive signals for the first switch and the second switch; and
   a current comparator having an inverting input configured to receive a current sense signal proportional to a current flowing through the inductor, and non-inverting input connected to ground.

3. The system of claim 2, wherein the linear amplifier includes a third switch and a fourth switch connected in series between the first voltage rail and the second voltage rail of the linear amplifier, and a comparator configured to generate gate drive signals for the third switch and the fourth switch.

4. A system comprising:
   a current-mode power converter configured to generate a voltage for a load;
   a linear amplifier connected to an output of the current-mode power converter, the linear amplifier being configured to reduce ripple current components generated by the current-mode power converter; and
   a rail voltage generator configured to reduce a first voltage rail of the linear amplifier and increase a second voltage rail of the linear amplifier so as to generate a reduced supply voltage for the linear amplifier, wherein the first voltage rail is connected to an output of a sourcing power converter, and wherein the second voltage rail is connected to an output of a sinking power converter, wherein the rail voltage generator comprises the sourcing power converter configured to reduce the first voltage rail and the sinking power converter configured to increase the second voltage rail, wherein an input of the sinking power converter is directly connected to the output of the sourcing power converter, wherein the sourcing power converter and the sinking power converter are configured to reduce a supply voltage of the linear amplifier, wherein the sourcing power converter is a buck power converter connected between a power source and the first voltage rail of the linear amplifier, and wherein the sinking power converter is a switched-capacitor power converter configured as a 2:1 step-down power converter having an input connected to an output of the buck power converter.

5. A method comprising:

configuring a current-mode power converter to operate in a switching mode;

configuring a linear amplifier to reduce ripple current components generated by the current-mode power converter; and reducing power losses of the linear amplifier through reducing a first voltage rail of the linear amplifier using a sourcing power converter and increasing a second voltage rail of the linear amplifier using a sinking power converter so as to generate a reduced supply voltage for the linear amplifier, wherein the first voltage rail is connected to an output of the sourcing power converter, and wherein the second voltage rail is connected to an output of the sinking power converter, wherein an input of the sinking power converter is directly connected to the output of the sourcing power converter, wherein the sourcing power converter and the second sinking power converter are configured to reduce a supply voltage of the linear amplifier, wherein the sourcing power converter is a buck power converter connected between a power source and the first voltage rail of the linear amplifier, and wherein the sinking power converter is a switched-capacitor power converter configured as a 2:1 step-down power converter having an input connected to an output of the buck power converter.

* * * * *

UNITED STATES PATENT AND TRADEMARK OFFICE
CERTIFICATE OF CORRECTION

| | |
|---|---|
| PATENT NO. | : 11,784,577 B2 |
| APPLICATION NO. | : 16/926516 |
| DATED | : October 10, 2023 |
| INVENTOR(S) | : Yushan Li et al. |

It is certified that error appears in the above-identified patent and that said Letters Patent is hereby corrected as shown below:

In the Claims

Column 20, Claim 5, Lines 13-14; please delete "the second sinking power" and insert --the sinking power--

Signed and Sealed this
Twenty-first Day of November, 2023

Katherine Kelly Vidal
*Director of the United States Patent and Trademark Office*